US007912240B2

(12) United States Patent
Madaffari et al.

(10) Patent No.: US 7,912,240 B2
(45) Date of Patent: Mar. 22, 2011

(54) DUAL DIAPHRAGM ELECTROACOUSTIC TRANSDUCER

(75) Inventors: Peter L. Madaffari, Camden, ME (US); Sietse Jacob Van Reeuwijk, Haarlem (NL)

(73) Assignee: Sonion Nederland B.V., Amsterdam (NL)

( * ) Notice: Subject to any disclaimer, the term of this patent is extended or adjusted under 35 U.S.C. 154(b) by 1124 days.

(21) Appl. No.: 11/596,248

(22) PCT Filed: May 13, 2005

(86) PCT No.: PCT/EP2005/005081

§ 371 (c)(1),
(2), (4) Date: Nov. 13, 2006

(87) PCT Pub. No.: WO2005/115053

PCT Pub. Date: Dec. 1, 2005

(65) Prior Publication Data

US 2008/0044044 A1 Feb. 21, 2008

Related U.S. Application Data

(60) Provisional application No. 60/571,083, filed on May 14, 2004, provisional application No. 60/634,230, filed on Dec. 8, 2004.

(51) Int. Cl.

| | |
|---|---|
| ***H04R 1/00*** | (2006.01) |
| ***H04R 9/06*** | (2006.01) |
| ***H04R 11/02*** | (2006.01) |
| *H04R 25/00* | (2006.01) |
| *H05K 5/00* | (2006.01) |

(52) U.S. Cl. ........ 381/420; 381/182; 381/186; 381/401; 181/144

(58) Field of Classification Search .................. 381/420
See application file for complete search history.

(56) References Cited

U.S. PATENT DOCUMENTS

| | | | |
|---|---|---|---|
| 2,832,843 | A | 4/1958 | Miessner |
| 3,873,784 | A | 3/1975 | Doschek |
| 4,176,249 | A | 11/1979 | Inanaga et al. |
| 4,472,065 | A | 9/1984 | Goodman |
| 4,665,550 | A | 5/1987 | Haas |
| 6,192,136 | B1 | 2/2001 | Azima et al. |
| 6,347,149 | B1 | 2/2002 | Bachmann et al. |
| 6,494,289 | B1 | 12/2002 | Bachmann et al. |

(Continued)

FOREIGN PATENT DOCUMENTS

EP 1257147 A2 11/2002

(Continued)

OTHER PUBLICATIONS

PCT International Search Report for International Application No. PCT/EP2005/005081, filed May 11, 2005, dated Sep. 1, 2005 (4 pages).

*Primary Examiner* — Curtis Kuntz
*Assistant Examiner* — Matthew Eason
(74) *Attorney, Agent, or Firm* — Nixon Peabody LLP

(57) ABSTRACT

The present invention relates to dual-diaphragm electroacoustic transducers wherein a common magnetic flux path comprises first and second magnetic gaps and a magnet assembly. The invention may provide a miniature transducer with a compact magnetic flux path of improved performance. Electroacoustic transducers in accordance with the invention may comprise a small number of separate parts and provide good acoustic conversion efficiency in a miniature or compact housing.

28 Claims, 13 Drawing Sheets

U.S. PATENT DOCUMENTS

| | | | | |
|---|---|---|---|---|
| 6,560,348 | B1 | 5/2003 | Bachmann et al. | |
| 6,622,817 | B1 | 9/2003 | Bachmann et al. | |
| 7,006,651 | B2 * | 2/2006 | Ueki | 381/396 |
| 7,567,680 | B2 * | 7/2009 | Murray et al. | 381/181 |
| 2003/0048920 | A1 | 3/2003 | Van Halteren et al. | |
| 2003/0076969 | A1 | 4/2003 | Han et al. | |
| 2004/0071303 | A1 * | 4/2004 | Furuya et al. | 381/182 |
| 2004/0076307 | A1 | 4/2004 | Pan et al. | |

FOREIGN PATENT DOCUMENTS

| | | | |
|---|---|---|---|
| EP | 1257147 | A3 | 9/2003 |
| EP | 1257147 | B1 | 12/2004 |
| WO | WO 03/063545 | | 7/2003 |
| WO | WO 2004012068 | | 2/2004 |

* cited by examiner

DUAL DIAPHRAGM ELECTROACOUSTIC TRANSDUCER

CROSS-REFERENCE TO RELATED APPLICATIONS

This application claims the benefit of U.S. Provisional Application No. 60/571,083, filed May 14, 2004, and U.S. Provisional Patent Application No. 60/634,230, filed Dec. 8, 2004.

The present invention relates to a miniature dual-diaphragm electroacoustic transducer wherein a common magnetic flux path comprises first and second magnetic gaps and a magnet assembly. The invention provides a miniature electroacoustic transducer with simplified magnetic flux path requiring a small number of separate parts and capable of providing superior acoustic conversion efficiency in a miniature housing. Consequently, transducers in accordance with the present invention are particularly well adapted for portable compact communication equipment such as mobile terminals, mobile or cellular phones, headsets, hearing prostheses etc.

BACKGROUND OF THE INVENTION

Due to continuing reductions in dimensions of portable communication equipment, there is a need in the art for improved electroacoustic transducers such as miniature loudspeakers or receivers that provide improved vibration performance and superior sound pressure output capability in a small package.

US 2003/0048920 A1 discloses a miniature dual-diaphragm electro-dynamic loudspeaker that comprises a magnet system disposed between a pair of oppositely positioned parallel diaphragms. A unidirectional magnetic flux is created within each of two unidirectional magnetic gaps by an associated magnet. A separate magnetic flux path extends around each of the magnetic gaps and its associated magnet in a plane substantially parallel to the oppositely positioned parallel diaphragms. Due to the unidirectional property of the magnetic flux in each magnetic gap both conductive coils are folded. While the disclosed miniature transducer has a number of noticeable advantages such as very small height, the need for folded conductive coils and separate magnetic flux paths around each unidirectional gap may render the disclosed transducer with less than optimal conversion efficiency. Conversion efficiency and size constraints are generally important performance measures of electroacoustic transducers, in particular for portable communication equipment like single cell driven devices such as hearing instruments.

U.S. Pat. No. 6,622,817 discloses a dual-panel loudspeaker working according to a bending wave principle comprising a motor structure with a common magnetic flux path. Two oppositely positioned and parallel sound panels are operable to overcome acoustic short circuiting between front and rear side sound radiation of a traditional single panel loudspeaker where front and rear sound radiation are out of phase.

A miniature electroacoustic transducer according to the present invention is particularly well-adapted for use in battery powered portable devices such as mobile terminals and hearing instruments and provides improved performance to one or several key performance measures such as cost, vibration output level, acoustical conversion efficiency, maximum sound pressure capability and package size.

DETAILED DESCRIPTION OF THE INVENTION

According to a first aspect of the invention there is provided a miniature electroacoustic transducer comprising a transducer housing having a sound aperture and a magnet assembly disposed in the transducer housing. The magnet assembly being adapted to generate a first magnetic flux with a first predetermined orientation within a first magnetic gap and adapted to generate a second magnetic flux with a second predetermined orientation within a second magnetic gap. The miniature electroacoustic transducer further comprising a first moveable assembly comprising a first electrically conductive coil positioned in the first magnetic gap and coupled to a first diaphragm to enable motion of the first moveable assembly in a first direction of motion substantially perpendicular to the first magnetic flux, and a second moveable assembly comprising a second electrically conductive coil positioned in the second magnetic gap and coupled to a second diaphragm to enable motion of the second moveable assembly in a second direction of motion substantially perpendicular to the second magnetic flux. A common magnetic flux path comprises the magnet assembly and the first and second magnetic gaps.

Miniature electroacoustic transducers according to the present invention are particularly well-adapted for application in compact portable communication equipment and in particular for very low power portable communication equipment such as hearing prostheses and other single cell powered equipment.

In the present description and claims, the term “miniature electroacoustic transducer” designates an electroacoustic transducer having outer dimensions smaller than 20 mm (length), 10 mm (width) and 6 mm (height), or in case of an annular or cylindrical transducer housing having an outer diameter smaller than 20 mm and a height less than 6 mm.

A miniature electroacoustic transducer according to the present invention may be embodied as a moving coil loudspeaker or receiver to provide a sound output through the sound aperture, or respective sound outputs through several sound apertures, of the housing, in response to a drive current applied to electrical terminals of the transducer. Alternatively, the miniature electroacoustic transducer may be embodied as a dynamic microphone converting an acoustical input signal, i.e. sound, into an electrical output signal representative of the acoustical input signal. In both embodiments of the invention, one or more cooperating sound apertures may be provided in the transducer housing for example in order to control directional properties of the electroacoustic transducer. The miniature electroacoustic transducer is preferably adapted to convert electrical/acoustical input signals across an entire audio frequency range between about 20 Hz and 20 kHz, or even more preferably across a narrower frequency range such as between 100 Hz and 10 kHz. For certain telecommunication applications, the useable frequency range of the present miniature transducer may be restricted to a range between about 300 Hz to about 4 kHz.

The magnet assembly may comprise a first magnet assembly adapted to generate the first magnetic flux within the first magnetic gap, and a second magnet assembly adapted to generate the second magnetic flux within the second magnetic gap. The use of first and second separate magnet assemblies advantageously support the provision of fully symmetrical electroacoustic transducers wherein magnitudes of the first and second magnetic fluxes are substantially equal.

Alternatively, the magnet assembly may exclusively include a single centrally located permanent magnet, preferably of simple shape such as annular, disc-shaped, cylindrical or rectangular. This latter embodiment of the invention provides a cost-effective miniature transducer by requiring only a small number of separate parts and an accompanying simplified assembly process.

The magnet assembly or assemblies may comprise a rare-earth type permanent magnet or magnets such as Nd—Fe—B magnets commonly designated as N37H.

The common magnetic flux path of the electroacoustic transducer preferably comprises a closed magnetic loop extending in a plane extending substantially parallelly with the first direction of motion of the first moveable assembly.

According to a particular advantageous embodiment of the invention, the magnet assembly and the first and second moveable assemblies form a mirror symmetrical entity or arrangement around a central plane extending parallelly to the first and second diaphragms. The first and second moveable assemblies posses substantially identical masses to provide a miniature transducer with superior vibration cancellation. The mirror symmetrical arrangement of the magnet assembly and the first and second moveable assemblies preferably comprises oppositely directed first and second magnetic fluxes such an inwardly radially oriented first magnetic flux and a outwardly radially second magnetic flux.

According to another advantageous embodiment of the invention, the transducer housing comprises a magnetically conductive first housing portion that surrounds or encloses a centrally positioned magnet assembly such as a single rare-earth type magnet like a Nd—Fe—B magnet. The magnet assembly is operatively secured to an inner side wall portion of the first magnetically conductive portion of the housing. The attachment between the magnet assembly and the first housing portion may be based on gluing or welding. Preferably, a peripheral portion of the magnet assembly abuts the inner side wall portion of the first housing portion to make effective use of the limited space available inside a miniature transducer. The magnet assembly is preferably of simple shape such as annular or disc-shaped, cylindrical or rectangular but may have other shapes such as generally polygonal. A mating internal wall shape of the first magnetically conductive portion of the housing is preferably selected. The first housing portion may advantageously surround and enclose the first moveable assembly and the second moveable assembly so as to provide a compact and preferably self-contained dual-diaphragm transducer core.

According to a preferred embodiment of the invention, the first and second directions of motion are either substantially identical or opposite. The transducer may be configurable by proper interconnection of external terminals to support in-phase or out-of-phase motion of the first and second diaphragms depending on a relative orientation of drive currents in the first and second electrically conductive coils.

The first and second electrically conductive coils may be directly or indirectly coupled to the respective diaphragms for example by directly attaching the conductive coils to the respective diaphragms by an epoxy resin or other suitable adhesive. Alternatively, the conductive coils may be indirectly coupled to the respective diaphragms through respective coil formers or bobbins that support the conductive coils. The bobbins are attached to the respective diaphragms to form intermediate coupling members between the diaphragms and conductive coils.

A substantially rectangular or cylindrical outer contour of the transducer housing is preferred, but the skilled person will notice that other shapes are possible as well. A diameter of a cylindrical housing for hearing aid application is preferably between 3.0 and 6.0 mm with a height between 4.0 mm and 6.0 mm.

A large variety of housing configurations are useable in various embodiments of the present miniature electroacoustic transducer where the transducer housing may have a single sound aperture combining frontal acoustic signals or frontal sound pressures from the first and second diaphragms. Alternatively, the transducer housing may have separate sound apertures for each of the frontal sound pressures and suitable housing structures for combining these frontal sound pressures may be provided inside a communication device in which the present transducer is integrated.

According to particular advantageous embodiment of the invention, the transducer housing comprises a first housing portion of magnetically permeable material surrounding the permanent magnet assembly or assemblies and the common magnetic flux path comprises the first housing portion. This allows a portion of the transducer housing to serve an additional function combing with the common magnetic flux path. One or several otherwise needed ferromagnetic members to conduct magnetic flux between the first and second magnetic gaps within the common flux path are no longer required. This feature leads to fewer parts and simplified assembly of the transducer. The first housing portion may extend axially to surround the first and second moveable assemblies. The transducer housing may comprise a second housing portion extending above and covering the first diaphragm to form a first front chamber having a first side facing or frontally facing sound aperture a third housing portion extending above and covering the second diaphragm to form a second front chamber having a second side facing or frontally facing sound aperture. The first and second housing portions may be shaped as respective lids comprising magnetically permeable material, such as a ferromagnetic alloy, and/or injection molded plastic parts.

The permanent magnet assembly or assemblies may be operatively attached to the first housing portion to fix their position and advantageously extend so that a peripheral surface of the permanent magnet assembly or assemblies abuts the first housing portion.

A very effective embodiment of the invention utilizes a centrally positioned and axially magnetized permanent magnet assembly or central magnet assembly having a closed peripheral magnet surface extending in a plane perpendicular to an axial direction wherein said closed peripheral magnet surface abuts an inner side wall of the first housing. The mating shapes of the magnet assembly and inner housing side wall may be circular, elliptical or polygonal etc. This latter embodiment is particularly well-suited for miniature transducers because a substantial part of the transducer volume enclosed or trapped below the first and second movable assemblies is occupied with permanent magnet material to provide high magnetic flux density within individual members of the common magnetic circuit, in particular within the first and second magnetic gaps. This design or construction of the transducer therefore makes efficient use of all available space inside the transducer housing and may be adapted so that volume enclosed between the first and second moveable assemblies and the first housing portion is divided into an upper back chamber arranged below the first diaphragm and a lower back chamber arranged below the second diaphragm by the central magnet assembly. Alternatively, the volume enclosed between the first and second moveable assemblies and the first housing portion may comprise a common back chamber created for example by an acoustic tunnel or connection extending through the central magnet assembly.

The upper and lower back chambers may comprise respective back chamber sound apertures or the common back chamber may comprise a back chamber sound aperture. A flexible way to control for back chamber volume of the present transducer is provided by an embodiment wherein an outer transducer housing portion forming a substantially closed acoustical chamber positioned adjacent to an outer surface portion of the first housing portion comprises an acoustical connection between back chamber sound aperture or apertures and the closed acoustical chamber to provide a joint and enlarged effective back chamber of the miniature electroacoustic transducer. A particularly attractive transducer in accordance with this latter embodiment is disclosed in connection with FIG. 2 below. The transducer may be embodied as two substantially separate sub-assemblies integrated into a single miniature loudspeaker by fixedly attaching the separate sub-assemblies to each other by welding, press fitting or gluing etc. A first subassembly comprises a cylindrical, or any other suitable shape, acoustical driver or core and the second subassembly comprises an outer housing having for example a generally rectangular shape. The back chamber sound aperture or apertures connecting the closed acoustical chamber to the back chamber(s) of the acoustical driver provides a simple and flexible design which allows tailoring transducer performance to specific applications by solely changing dimensions of the rectangular outer housing while retaining all dimensions of the acoustical driver.

The miniature electroacoustic transducer according to the present invention may comprise a centrally positioned magnetically permeable structure forming part of the common magnetic flux path so as to conduct magnetic flux between the first and second magnet assembly and/or between the first and second magnetic gaps. This centrally positioned magnetically permeable structure may additionally form part of a second magnetic flux path for embodiments of the invention that incorporates unidirectional or discontinuous magnetic gaps and have first and second separate common magnetic flux paths. This centrally positioned magnetically permeable structure preferably comprises a laminated structure of magnetically permeable material such as a ferromagnetic alloy like Vacoflux. The outer surface of the centrally positioned magnetically permeable structure may advantageously provide an inner boundary surface of at least the first and second magnetic gaps and, optionally, an inner boundary surface all magnetic gaps of the electroacoustic transducer.

According to several embodiments of the invention as described below with reference to FIGS. 1-9, the first magnetic gap comprises a continuous magnetic gap and the second magnetic gap comprises a continuous magnetic gap. First and second straight circular, rectangular or oval conductive coils are oppositely positioned within respective continuous magnetic gaps. Each of straight circular, rectangular or oval conductive coils is oriented substantially parallelly to its associated diaphragm and preferably attached directly to the diaphragm on a flat end surface or edge of the conductive coil.

In one embodiment of the invention, the first magnet assembly comprises a substantially collar or doughnut shaped magnet positioned coaxially around a correspondingly shaped first electrically conductive coil. The collar or doughnut shaped magnet is magnetized to generate an inwardly radially oriented first magnetic flux. The second magnet assembly comprises a substantially collar or doughnut shaped magnet coaxially surrounding a correspondingly shaped second electrically conductive coil and magnetized to generate an outwardly radially oriented second magnetic flux. Simplified magnet shape may be obtained if the magnet assemblies are formed by respective arrays of flat rectangular magnets wherein the first magnet assembly comprises a substantially circular, oval or rectangular array of flat magnets positioned coaxially around the first electrically conductive coil and adapted to generate an inwardly oriented first magnetic flux. The second magnet assembly comprises a substantially circular, oval or rectangular array of flat magnets positioned coaxially around the second electrically conductive coil and adapted to generate an outwardly oriented second magnetic flux. These embodiments of the electroacoustic transducer preferably comprise a centrally positioned cylindrical or rectangular magnetically permeable structure that forms part of the common magnetic flux path so as to conduct magnetic flux between the first and second magnet assembly. A surface portion of this centrally positioned magnetically permeable structure may advantageously constitute inner surfaces of the first and second magnetic gaps.

Alternatively, the first and second magnet assembly may be provided as a pair of centrally-located permanent magnets positioned in abutment with the centrally positioned cylindrical or rectangular magnetically permeable structure that forms part of the common magnetic flux path.

According to other embodiments of the invention as described below with reference to FIGS. 10-13, the magnetic gaps of the electroacoustical transducer comprise four discontinuous or unidirectional magnetic gaps and each of the first and second electrically conductive coils is positioned in a set of discontinuous magnetic gaps. In several embodiments of the invention, the magnetic circuit of the electroacoustic transducer comprises both a first and a second common magnetic flux path. Each common magnetic flux path comprises a magnet assembly and an associated set of magnetic gaps.

According to one embodiment of the invention the first magnet assembly comprises a first pair of magnets having the first magnetic gap positioned between side surfaces of the first pair of magnets, and the second magnet assembly comprises a second pair of magnets having the second magnetic gap positioned between side surfaces of the second pair of magnets. The first and second electrically conductive coils are adjacently positioned and extend into the first and second magnetic gaps and are oriented in a plane extending substantially perpendicular to the first and second diaphragms, i.e. vertically oriented.

Another embodiment comprises a first magnet assembly adapted to generate the first and second magnetic fluxes in first and second discontinuous magnetic gaps. A second magnet assembly adapted to generate third and fourth magnetic fluxes in third and fourth discontinuous magnetic gaps. A first common magnetic flux path comprises the first magnet assembly and the first and second discontinuous magnetic gaps while a second common magnetic flux path comprises the second magnet assembly and the third and fourth discontinuous magnetic gaps. Several voice coil arrangements are possible where one embodiment has the first electrically conductive coil positioned in the first and third discontinuous magnetic gaps to comprise a first portion of coil windings positioned within the first common magnetic flux path and second portion of coil windings positioned within the second common magnetic flux path while the second electrically conductive coil is positioned in the second and fourth discontinuous magnetic gaps to comprise a first portion of coil windings positioned within the first common magnetic flux path and second portion of coil windings positioned within the second common magnetic flux path. An electroacoustic transducer with a pair of oppositely arranged folded voice coils may embody this latter transducer design so that the first electrically conductive coil comprises a bent coil having a bridging portion and a pair of coil portions substantially orthogonal thereto where the bridging portion is oriented in a plane extending substantially parallelly with the first diaphragm. The second electrically conductive coil likewise comprises a bent coil having a bridging portion and a pair of coil portions substantially orthogonal thereto. The bridging portion is oriented in a plane extending substantially parallelly with the second diaphragm.

Another embodiment comprises the first and second coil winding portions of a first straight electrically conductive coil positioned in the first and second discontinuous magnetic gaps, respectively, and first and second coil winding portions of a straight second electrically conductive coil positioned in the third and fourth discontinuous magnetic gaps, respectively. This embodiment has laterally positioned electrically conductive coils wherein a closed curve of a plane end surface of a conductive coil can be directly attached to the associated diaphragm along a substantially circular, rectangular or oval attachment area. By suitably selecting dimensions of the electrically conductive coils it is possible to drive the diaphragms across a substantial portion of its area such as more than 25% or preferably more than 50% of the diaphragm area.

Alternatively, the first and second straight electrically conductive coils may be oriented substantially orthogonally to surfaces of the first and second diaphragms and extend into the first and second discontinuous magnetic gaps and into the third and fourth discontinuous magnetic gaps, respectively. This latter embodiment of the invention therefore comprises vertically oriented electrically conductive coils wherein a plane side surface of each conductive coil may be directly secured to the associated diaphragm along a line shaped contact area.

According to particularly attractive embodiments of the invention, the first and second magnet assembly and the first and second moveable assemblies form a mirror symmetrical physical arrangement or layout around a central plane extending parallelly to the first and second diaphragms. The transducer housing and/or sound aperture may additionally be symmetrically constructed and arranged around the central plane. According to this electroacoustic transducer design, magnetic poles between the upper and lower magnet assembly may advantageously be swapped so that first and second magnetic fluxes are substantially oppositely directed. All embodiments of the invention may benefit from employing first and the second moveable assemblies of substantially identical masses to reduce vibration output of the electroacoustic transducer during loudspeaker operation.

According to a second aspect of the invention there is provided a miniature electroacoustic transducer comprising a transducer housing having transducer motor disposed therein. The transducer housing comprising a magnetically permeable housing portion at least partially forming an acoustical chamber surrounding an electrical coil wound around a ferromagnetic core and electrically connected to the transducer motor. End surfaces of the ferromagnetic core are operatively connected to an inner surface of the magnetically permeable housing portion to provide a magnetic flux return path for the ferromagnetic core. The transducer motor may comprise a moving coil speaker core or a moving armature receiver core adapted to generate sound or acoustical signals that are radiated from one or several sound outlet ports in the transducer housing. The moving coil loudspeaker may comprise a miniature dual-diaphragm loudspeaker according to the first aspect of the present invention.

BRIEF DESCRIPTION OF THE DRAWINGS

Preferred embodiments of the invention in form miniature hearing aid receivers and miniature loudspeakers will be described in the following with reference to the accompanying drawings, wherein.

DETAILED DESCRIPTION OF PREFERRED EMBODIMENTS

Figure 1:
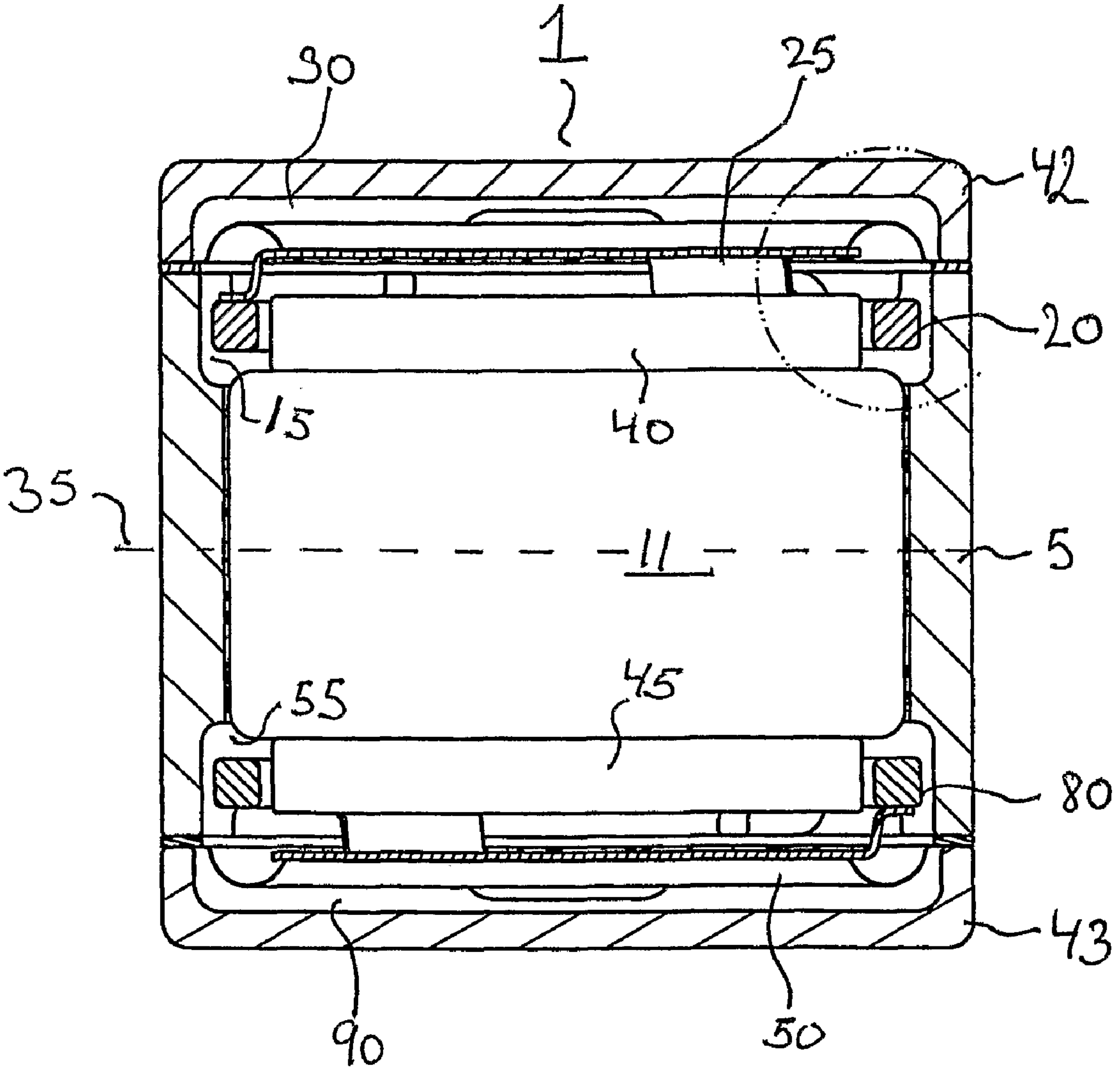
FIG. 1 shows an axial cross-sectional view of a cylindrical dual-diaphragm speaker according to a first embodiment of the invention.

In the description of the preferred embodiments of the invention, similar or corresponding features of different embodiments are assigned with identical reference numerals.

The embodiments of FIGS. 1-4 are most extensively described in the following, but the skilled person will immediately notice that many design or constructional features of these embodiments such as dimensions, shapes, materials etc. may be readily applicable to the other disclosed embodiments as well.

FIG. 1 shows a vertical cross-sectional view of a miniature dual-diaphragm moving coil electroacoustic transducer 1 which preferably operates as a loudspeaker or receiver for generation of acoustical signals or sound pressure signals in a predetermined frequency range such as the entire audible frequency range between about 20 Hz and 20 kHz, or a part thereof such as 100 Hz and 10 kHz. Alternatively, the dual-diaphragm electroacoustic transducer may operate as a microphone for receipt of acoustical signals in the predetermined frequency range by converting impinging acoustical signals into corresponding electrical signals.

In the present embodiment, the transducer 1 is configured as a miniature loudspeaker or receiver suitable for integration into a mobile terminal or hearing instrument. The miniature loudspeaker 1 comprises a substantially cylindrical housing 5 fabricated in Vacoflux or other suitable magnetically permeable material such as ferromagnetic materials or compounds like cobalt-iron alloys with trace elements. The magnetically permeable material preferably exhibits a high saturation flux density and high relative permeability such as relative permeability above 100, or more preferably above 1000, or even more preferably above 10000. The miniature loudspeaker's physical layout comprises two substantially identical halves arranged substantially mirror symmetrically around a central plane 35 extending substantially parallelly to an upper diaphragm 25 and a lower diaphragm 50. The outer diameter of the housing is preferably selected to a value between 3 and 4 mm, such as 3.1 mm and the length of the housing to a value between 3.0 and 5.0 mm.

The cylindrical housing 5 is placed coaxially around a central motor assembly. An annular upper lid 42 covering the upper diaphragm 25 forms an upper front chamber 30 of the miniature loudspeaker 1. The annular upper lid 42 abuts an upper rim portion of the cylindrical housing 5. An upper side facing front chamber sound aperture (not shown) is positioned in the annular upper lid 42 and/or in an area close to an upper rim portion of the cylindrical housing 5. A corresponding mirrored structure is formed by lower lid 43 and lower front chamber 90 with a lower side facing front chamber sound aperture (not shown). Alternatively, upper and lower side facing front chamber sound apertures could be replaced by respective front facing sound apertures positioned axially above the upper and lower diaphragms 25, 50, respectively, to form an end-fire type of miniature loudspeaker.

Upper and lower flat disc-shaped pole pieces 40 and 45, respectively, are oppositely positioned around a single centrally positioned disc-shaped permanent magnet 11. Upper and lower flat disc-shaped pole pieces 40 and 45 are arranged in abutment with respective magnetic poles of the centrally positioned disc-shaped magnet 11 and adapted to conduct magnetic flux toward ring shaped continuous upper and lower magnetic gaps, 15 and 55, respectively. In the present embodiment of the invention, the single disc-shaped permanent magnet 11 or permanent magnet 11 is the exclusive magnet assembly of the electroacoustic transducer 1. The permanent magnet 11 preferably comprises a magnetic alloy or compound based on Nd—Fe—B alloys such as N37H. In the present embodiment of the invention, the permanent magnet 11 is adapted to create numerically identical flux densities inside the collar or ring shaped magnetic gaps 15 and 55. The magnetic flux density is preferably selected to a value between 0.5 and 1.5 Tesla or even more preferably between 0.7 and 1.2 Tesla.

The single annular or disc-shaped magnet 11 is substantially axially magnetized to create a radial and inwardly oriented magnetic flux within the ring shaped upper magnetic gap 15 and a radial outwardly oriented magnetic flux within ring shaped lower magnetic gap 55 by virtue of upper and lower flat disc-shaped pole pieces 40 and 45, respectively, both of which comprise magnetically permeable material such as a ferromagnetic alloy or compound for example Ni—Fe. An electrically conductive circular straight upper coil 20, or upper voice coil, is positioned inside the upper magnetic gap 15 and coaxially surrounding the disc-shaped pole piece 40 in a manner leaving sufficient clearance to allow the straight upper coil 20 unrestricted displacement along a path substantially perpendicular to the radially-oriented magnetic flux of the ring shaped upper magnetic gap 15. The upper voice coil 20 may comprise windings of individually insulated aluminium or copper wires of diameters less than 50 μm, or preferably less than 20 μm, such as about 12 μm and with a minimum insulation layer consistent with coil formation.

A portion of the cylindrical inner housing forms part of a common magnetic flux path of the miniature loudspeaker 1. The common magnetic flux path additionally comprises upper and lower magnetic gaps, 15 and 55, respectively, and upper and lower pole pieces (40, 45), respectively. Accordingly, the present embodiment comprises a single permanent magnet 11 and a single common magnetic flux path that extends through both of the ring shaped continuous upper and lowers magnetic gaps, 15 and 55, respectively. The permanent magnet 11 creates a radial inwardly oriented magnetic flux within the upper magnetic gap 15 and an opposite outwardly oriented magnetic flux within lower magnetic gap 55 of substantial equal magnitude. The upper voice coil 20 is positioned solely in the upper magnetic gap 15 and the lower voice coil 80 is solely positioned in the lower magnetic gap 55.

The central permanent magnet 11 has a diameter that ensures that a circumferential edge thereof contacts and abuts an inner sidewall portion of the cylindrical housing 5. The present embodiment is particularly well-suited for miniaturization because a substantial part of the volume or space enclosed or trapped below the upper and lower diaphragms 25, 50, respectively, is occupied with magnet material. This construction therefore makes efficient use of all available space inside the transducer housing 5. The housing 5 preferably comprises a ferromagnetic alloy or compound such as a cobalt-iron alloy with trace elements, often sold under trade names such as Vacoflux, Hiperco and Vanadium Permendur, for optimum magnetic performance. Naturally, the single centrally positioned magnet 11 could be replaced with a magnet assembly comprising pair of separate and abutted magnets of appropriate polarity. According to the present embodiment of the invention a pair of side-facing acoustical apertures or connections (not shown) is provided in the wall of the cylindrical inner housing portion 5 and acoustically coupled to respective back chambers enclosed below diaphragms 25, 50.

The direction of motion of the straight upper coil 20 is substantially perpendicular to both the radially-oriented magnetic flux in the annular upper magnetic gap 15 and to a direction of drive current flowing in coil windings of upper coil 20 in accordance with the well-known "right-hand rule":

$$\vec{F}=(\vec{I}\times\vec{B})*L;\ \text{wherein}$$

F is an electromagnetic force vector caused by current I running in the upper coil 20 having a wire length, L, positioned inside the upper magnetic gap 15 wherein the magnetic flux density, B, resides. F is accordingly acting on an upper moveable assembly that comprises the upper voice coil 20 and the upper diaphragm 25 and possibly any adhesive agent or other attachment means bonding the upper voice coil 20 and the upper diaphragm 25 together.

A circular upper edge portion of the upper coil is preferably attached directly to a periphery of the circular upper diaphragm 25 by means of a suitable adhesive such as an epoxy resin. Accordingly, when the straight upper coil 20 oscillates in response to a drive current applied thereto, a corresponding movement is inflicted upon the upper diaphragm 25 which in turn creates a corresponding alternating sound pressure inside the front acoustical chamber 30.

The upper diaphragm 25 preferably comprises a base layer of thin circular plastic film, such as a piece of 1 to 20 μm thick polyethylene terepthalate. An adhesively attached 20-50 μm thick foil of aluminium or aluminium-magnesium alloy could optionally be attached or bonded to the base layer of the upper diaphragm 25 and utilized to reinforce the circular upper diaphragm 25.

The mirror symmetrical lower portion of the miniature loudspeaker 1 below the indicated plane of symmetry 35 will not be extensively described in the following. The operation, materials, parts and dimensions of this lower portion substantially correspond to those of the respective counterparts of the upper portion of the miniature loudspeaker. Accordingly, the present embodiment of the miniature loudspeaker 1 has a substantially mirror symmetrical physical design to provide a vibration-balanced transducer construction or design which theoretically allows complete cancellation of vibration output of the receiver 1 caused by vibration of the upper and lower movable assemblies. A practical miniature loudspeaker 1 can of course not achieve perfect mirror symmetry but even within practical matching limits of important vibration factors a significant reduction in vibration magnitude can be achieved compared to a vibration magnitude of a corresponding single-diaphragm miniature loudspeaker. Important vibration factors comprise the matching of masses of the upper and lower movable assemblies and the matching of suspension compliances of the upper and lower diaphragms.

In operation, two pairs of externally accessible electrical terminals (not shown) of the receiver 1 are connected to a respective electrically conductive upper and lower coils 20 and 80 to allow independent application of drive voltage and current for each of the halves of the miniature loudspeaker 1 if desired. The miniature loudspeaker 1 is preferably operated by supplying substantially identical but oppositely phased drive currents to the upper and lower voice coils thereby ensuring the upper and lower diaphragms 25 and 50 are moving in phase. Alternatively, the transducer may be provided with a single pair of externally accessible electrical terminals and the upper voice coil 20 and the lower voice coil 80 internally connected in series.

Figure 2:
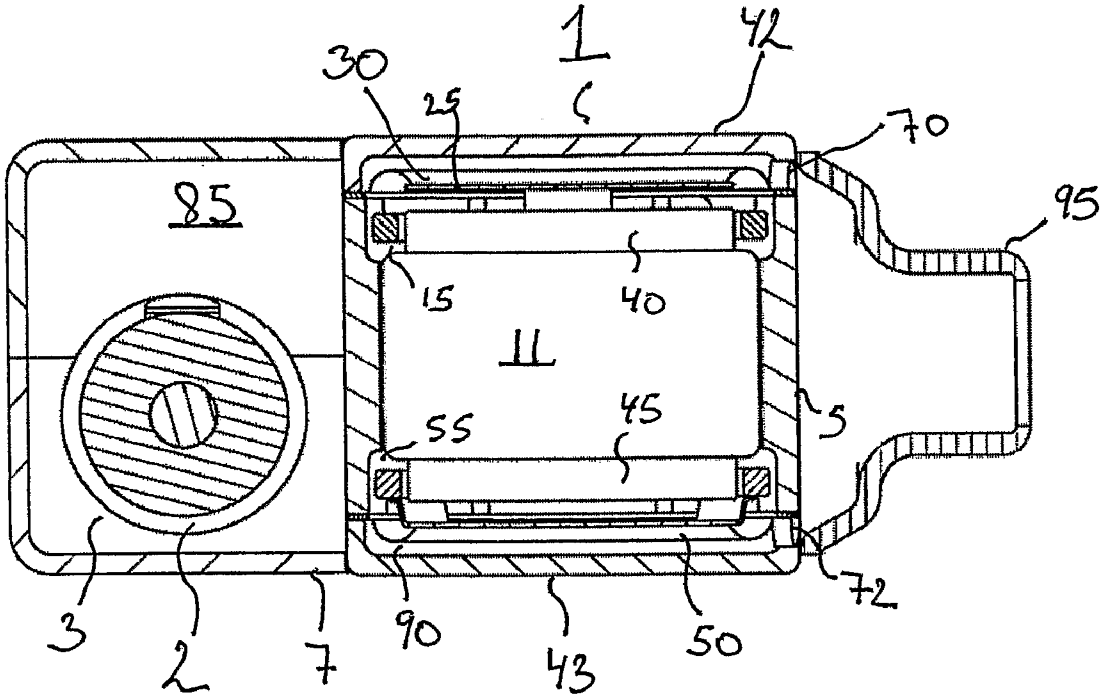
FIG. 2 shows a vertical cross-sectional view of a second embodiment of the invention in form of a hearing aid receiver comprising an internally mounted cylindrical dual-diaphragm speaker.

FIG. 2 shows a vertical cross-sectional view of second embodiment of the present invention wherein the cylindrical dual-diaphragm transducer described above in connection with FIG. 1 serves as a cylindrical acoustical driver or core integrated into a generally rectangular outer housing 7 that comprises a single sound outlet or sound aperture 95 surrounding first and second side-facing front chamber sound apertures, 70 and 72, respectively, to sum respective sound pressures generated by the first and second diaphragms. A summed or resulting sound pressure is directed out through the sound outlet 95. An annular upper lid 42 with a downwardly extending rim extends above and covers the first diaphragm 25 to form an upper front chamber 30 wherein the first or upper side facing sound aperture (not shown) is arranged. An identical lower lid 43 extends above and covers the second diaphragm 50 to form a lower front chamber 90 wherein the second or lower side facing sound aperture (not shown) is arranged.

Upper and lower back chambers of the miniature loudspeaker are positioned below the respective diaphragms 25, 50. Upper and lower back chamber sound apertures (refer items 26 and 28 of FIG. 4) acoustically connect the upper and lower back chambers with a common closed back chamber 85 formed inside a rear portion of the rectangular outer housing 7. This common back chamber 85 serves to enlarge a total back chamber volume of the miniature loudspeaker 1 and improves its acoustical performance by extending its low frequency response and low-frequency maximum output sound pressure capability. As previously described the cylindrical housing 5, upper lid 42 and lower lid 43 are preferably manufactured in magnetically permeable material and may serve to enclose or surround a substantially self-contained dual-diaphragm loudspeaker as disclosed in FIG. 1.

The miniature loudspeaker 1 of FIG. 2 is preferably manufactured by assembling the rectangular outer housing 7 and punch or laser cut a pair of substantially circular and vertically aligned apertures in a top cover and bottom cover of the rectangular outer housing 7. Each of these circular apertures has diameter which closely corresponds to the outer diameter of the cylindrical self-contained dual-diaphragm loudspeaker 1 (FIG. 1) to allow it to be inserted and rigidly joined to the rectangular outer housing 7 by press-fitting these parts together. Alternatively, the housings may also be joined by welding or gluing them together. The housing 5 of the cylindrical acoustical core is preferably magnetically and electrically connected to the rectangular outer housing 7 to allow an entire outer housing surface (comprising housing portions 7, 42 and 43) to function as an effective shield against external electrical and magnetic fields.

Alternatively, the housing 5 of the cylindrical acoustical core may be resiliently suspended inside the rectangular outer housing 7 to attenuate residual mechanical vibration generated by the cylindrical acoustical core. The suspension could comprise suitably shaped elastomeric member or members inserted between for example the upper and lower lids 42 and 43 and portions of the rectangular outer housing 7.

Outer dimensions of the rectangular outer housing 7 may be adapted over a wide range to suit a variety of applications. A hearing aid loudspeaker or receiver preferably has a height between 2.5 and 5.0 mm, a width between 3.0 and 6.0 mm, and a length (measured without the sound port 95) between 5.0 and 8.0 mm. The dimensions of the housing 5 of the cylindrical acoustical core may naturally be adapted to fit those dimensions selected for the rectangular outer housing 7.

An inductor 3, comprising an elongate electrical coil wound around a ferromagnetic core or bobbin, 2 is positioned in the common back chamber 85 of the miniature loudspeaker 1. The inductor 3 is electrically coupled in series with both of the electrically conductive coils or voice coils, 20 and 80. While this inductor 3 is an entirely optional component in the present embodiment of the invention, it has certain desirable properties for applications where the miniature loudspeaker 1 is driven by a switching amplifier or class D amplifier such as an analog or digital Pulse Width Modulation (PWM) or Pulse Density Modulation (PDM) amplifier. These switching amplifiers are typically based on an ultrasonic pulse modulation frequency situated somewhere in the frequency range 100 kHz to 10 MHz. The load impedance presented by the miniature loudspeaker 1 can advantageously be sufficiently large in the relevant frequency range to minimize switching losses incurred by switching current flowing through the load and output transistors of the switching amplifier. The inductor 1 may have an inductance between 0.5 and 5.0 mH, or more preferably between 1 and 2.0 mH, and a DC series resistance between 10 and 100 ohm so as to raise a high-frequency impedance of the miniature loudspeaker 1 as presented to the switching amplifier through a pair of external electrical terminals (not shown).

The ferromagnetic core or bobbin 2 of the coil 3 may advantageously be magnetically connected to the housing portion 5 of the cylindrical acoustical driver and/or to the rectangular outer housing 7 to provide a flux return path of the coil 3. This feature is particularly helpful because it significantly attenuates electromagnetic signals generated by applying the above-mentioned pulse modulation frequency to the coil 3 and prevents such disturbing electromagnetic signals from leaking out of the interior of the miniature loudspeaker 1. The useful properties derived from magnetically connecting the ferromagnetic core 2 with the ferromagnetic housing 7 are clearly equally applicable to differently shaped transducer housings and other types of moving coil speaker designs, for example a traditional single diaphragm transducer design etc.

Figure 3:
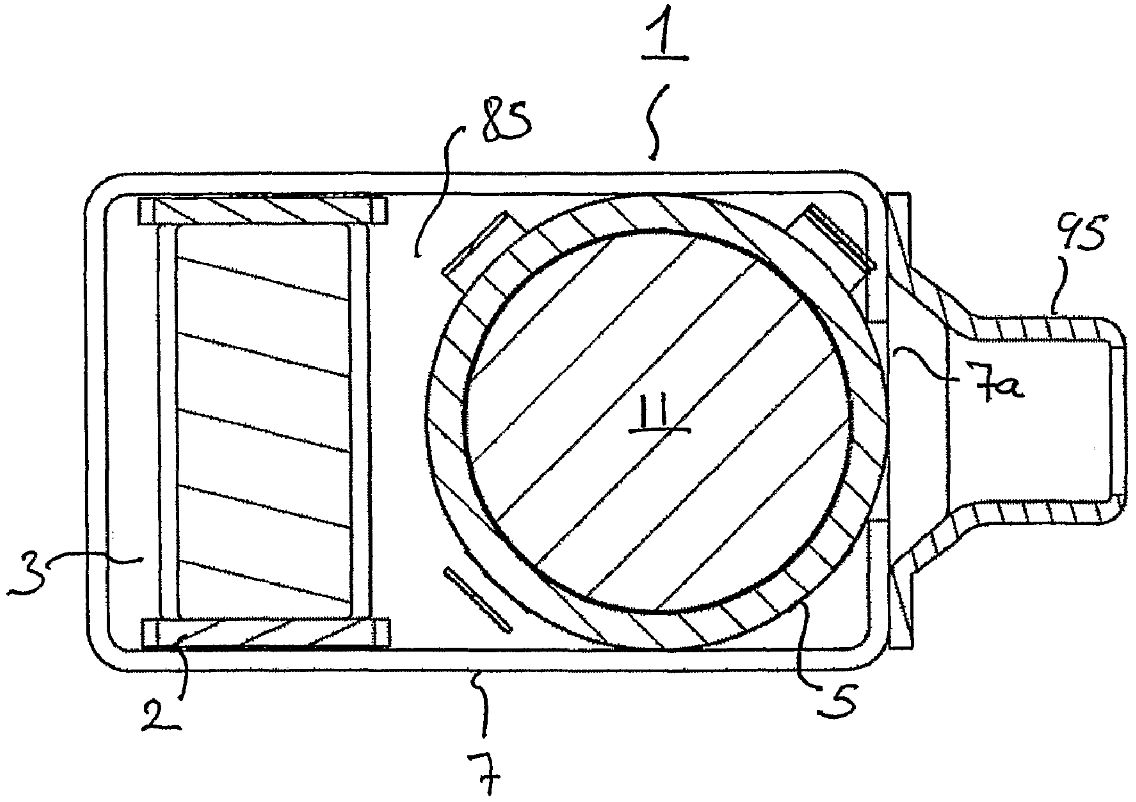
FIG. 3 shows a horizontal cross-sectional view of the hearing aid receiver of FIG. 2.

FIG. 3 is a central horizontal cross-sectional view of the miniature loudspeaker 1 disclosed and discussed above in connection with FIG. 2. End flanges of the ferromagnetic core of the coil 3 are magnetically connected to respective sidewall portions of the ferromagnetic rectangular outer housing 7 by press-fitting these parts together so as to provide a desirable flux return path for the coil 3. The rectangular outer housing 7 comprises a frontal rectangular aperture 7*a* extending from the bottom cover to the top cover of the outer housing 7. A peripheral portion of the cylindrical housing 5, upper lid 42 and lower lid 43 projects into this frontal rectangular aperture 7*a* and the first and second side-facing front chamber sound apertures, 70 and 72, respectively (FIG. 2), extend into this the frontal rectangular aperture 7*a* to acoustically connect these sound apertures with the sound outlet or spout 95. A first flat voice coil lead 14 of the upper voice coil (not shown) and a second flat voice coil lead 15 of the lower voice coil (not shown) both extend to the outside of the cylindrical acoustical core and are available for respective connections to the coil 3 and an external electrical terminal (not shown) of the miniature loudspeaker 1.

Figure 4:
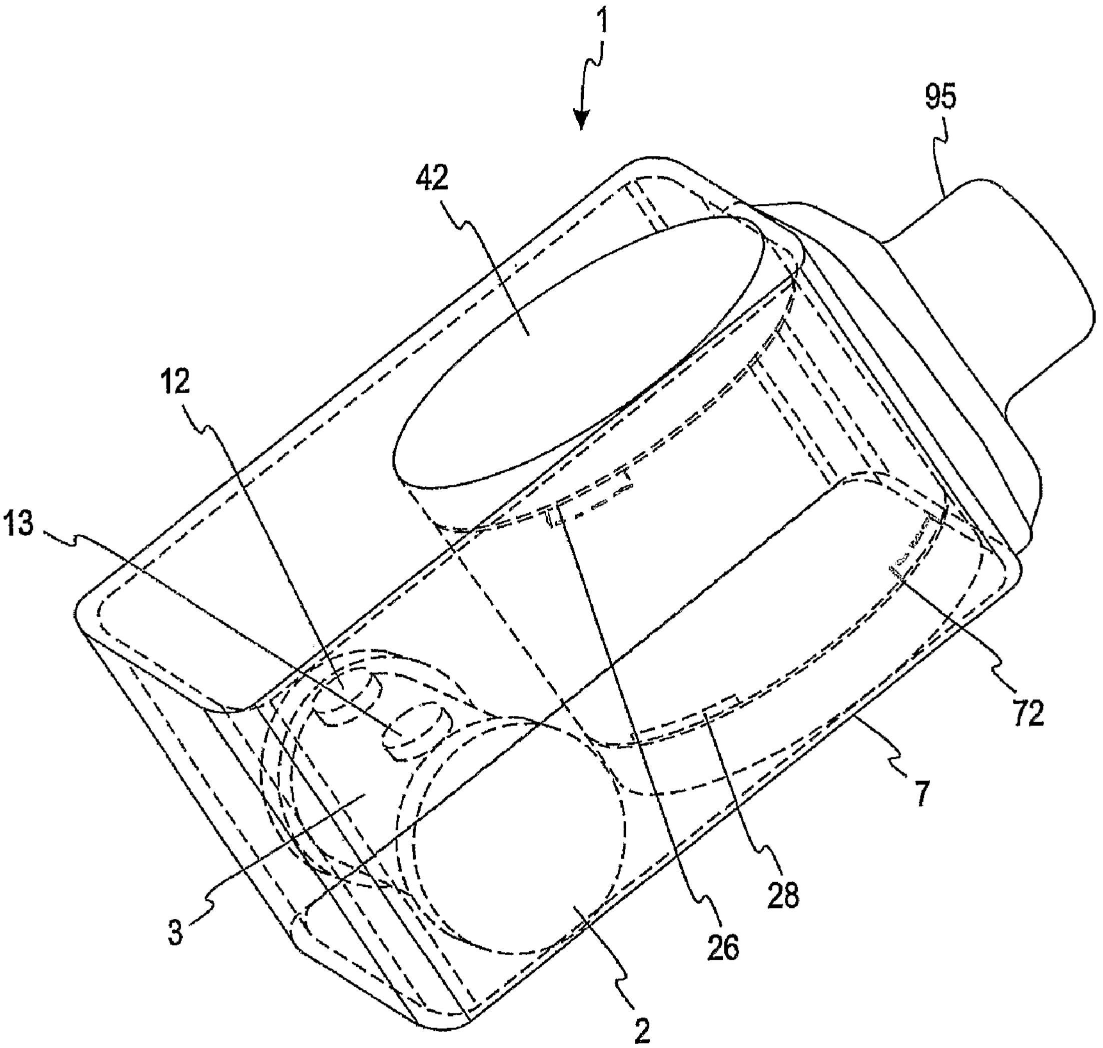
FIG. 4 is a 3D perspective view of internal parts of the hearing aid receiver of FIG. 2, FIG. 5*a-b* show vertical and horizontal cross-sectional views of a rectangular dual-diaphragm receiver or loudspeaker comprising an inner central cylindrical magnet structure according to a third embodiment of the invention.

FIG. 4 is a perspective view of internal features and components of the miniature loudspeaker 1 disclosed and discussed above in connection with FIGS. 2 and 3. A portion of the housing 5 of the cylindrical acoustical core which faces the common back chamber 85 comprises the upper and lower back chamber sound apertures, 26, 28, respectively. The upper and lower back chamber sound apertures, 26, 28, respectively are formed as circumferentially extending and through-going slots adjacent to the upper and lower lids, 42, 43, respectively. Naturally other shapes or positions may alternatively be used for the placement and shape of the upper and lower back chamber sound apertures, 26, 28, respectively. The coil 3 comprises a pair of solder pads (12, 13) to provide respective electrical connections. Preferably one solder pad 12 is electrically connected to a first external terminal (not shown) of the miniature loudspeaker 1 while the other solder pad 13 is electrically connected first flat voice coil lead (item 14 of FIG. 3) of the upper voice coil (not shown) of the cylindrical acoustical core. The upper and lower voice coils are internally connected in cascade and outputs the second voice coil lead (item 15 of FIG. 3) of the lower voice coil which is connected to a second external terminal (not shown) of the miniature loudspeaker 1. Consequently, the coil 3 and the upper and lower voice coils are all connected in cascade.

Figure 5A:
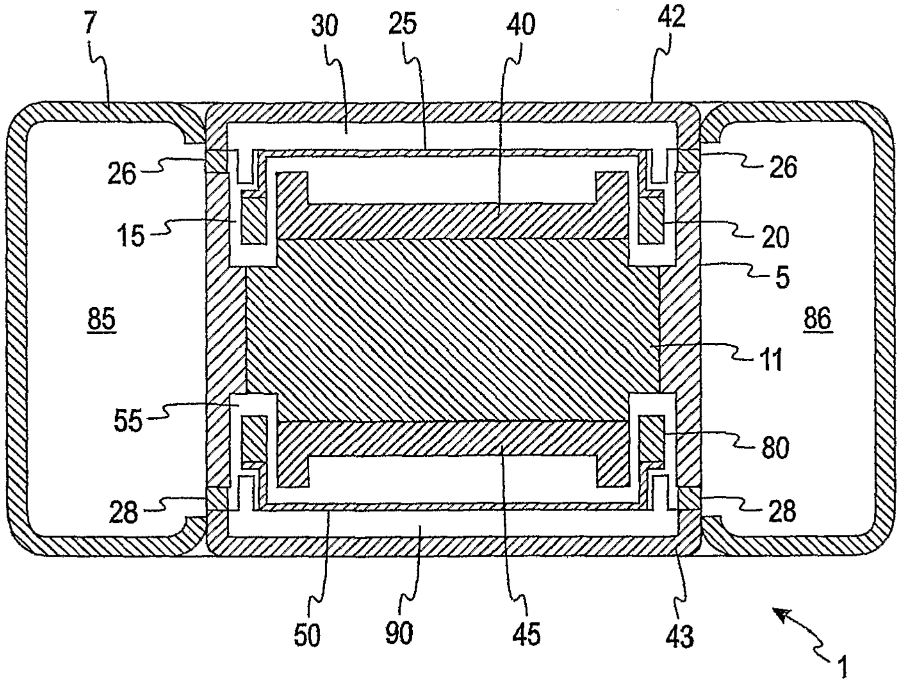
Figure 5B:
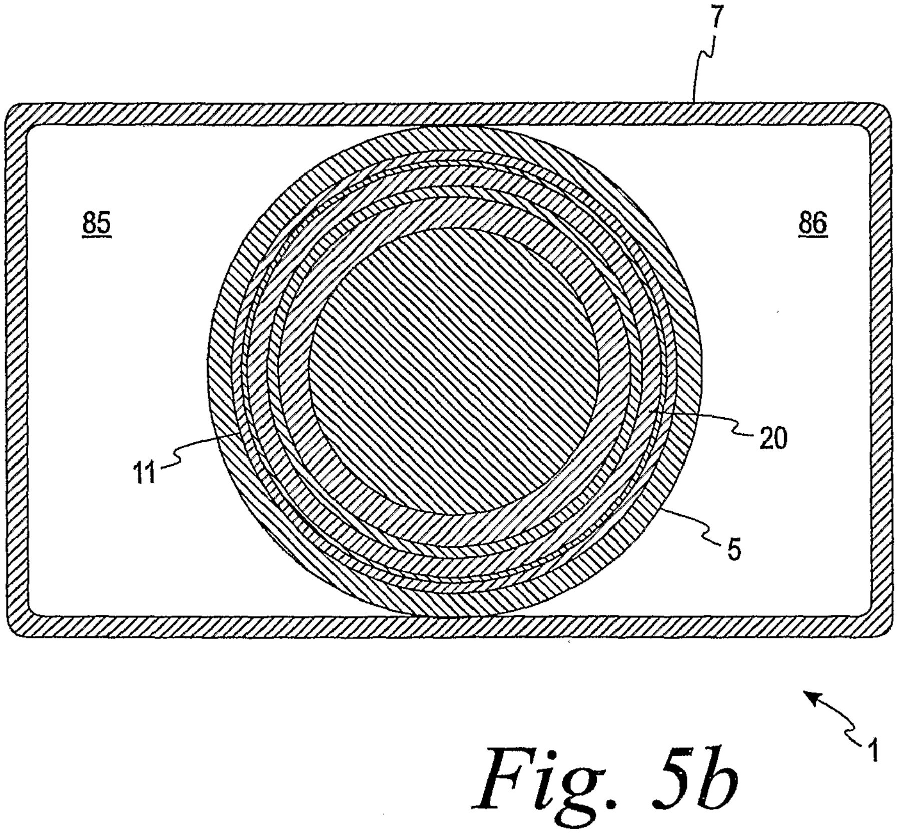

FIGS. 5*a* and 5*b* show vertical and horizontal cross-sectional views of another advantageous embodiment of the invention wherein the electroacoustic transducer 1 comprises a substantially rectangular outer housing portion 7 and a cylindrical inner housing portion 5 rigidly connected with the rectangular outer housing portion 7. The cylindrical inner housing portion 5 is placed coaxially around a central motor assembly. An annular upper lid 42 covers and protects the upper diaphragm 25 from damage and an acoustically transparent protection grid (not shown) may advantageously cover a central sound aperture (not shown) to provide superior protection against damage. The annular upper lid 42 is positioned above the upper diaphragm 25 and abuts the cylindrical inner housing portion 5 through a circular rim portion to create an upper front volume 30. A corresponding lid, front chamber structure and sound aperture is provided in the mirror symmetrical lower portion of the electroacoustic transducer 1 which leaves the present embodiment of the invention with two separate sound apertures or ports.

Upper and lower flat disc-shaped pole pieces 40 and 45, respectively, are oppositely positioned around a single centrally positioned disc-shaped magnet 11. Upper and lower flat disc-shaped pole pieces 40 and 45 are arranged in abutment with respective magnetic poles of the centrally positioned disc-shaped magnet 11 and adapted to conduct magnetic flux toward circular upper and lower magnetic gaps 15 and 55, respectively. In the present embodiment of the invention, the single disc-shaped magnet 11 constitutes the exclusive magnetic means of the electroacoustic transducer 1 and may comprise a rare-earth type of magnet such as Nd—Fe—B magnet commonly designated as N37H. The disc-shaped magnet 11 is magnetized in a substantially axial direction and adapted to create a radial and inwardly oriented magnetic flux within the circularly shaped upper magnetic gap 15 and a radial outwardly oriented magnetic flux within circularly shaped lower magnetic gap 55 by virtue of the upper and lower flat disc-shaped pole pieces 40 and 45, respectively, which both comprise material of high magnetic permeability such as ferromagnetic compound or alloy for example Ni—Fe. An electrically conductive circular straight upper coil 20, or straight upper coil, is positioned inside the upper magnetic gap 15 and coaxially around the disc-shaped pole piece 40 in a manner leaving sufficient clearance to allow the straight upper coil 20 unrestricted displacement along a path substantially perpendicular to the radially-oriented magnetic flux of the upper magnetic gap 15. The centrally positioned disc-shaped magnet 11 comprises an upper and a lower radially extending notch or step along an upper and lower periphery of the disc-shaped magnet 11. While these peripheral steps are entirely optional they provide an extended range of deflection or displacement for the upper and lower voice coils, 20 and 80, respectively. This advantageous feature translates into an improved maximum output sound pressure capability. Furthermore, experimental results obtained from a prototype transducer have demonstrated that the provision of the pair of peripheral steps in disc-shaped magnet 11 greatly improved uniformity of the magnetic field in the upper and lower magnetic gaps 15, 55, respectively, thereby improving the linearity of the electroacoustic transducer 1. A prototype of the present transducer embodiment targeted for hearing aid applications, has been constructed with outer dimensions in terms of width, height and length of 3.36 mm, 2.86 mm and 5.56 mm. The prototype used a cylindrical inner housing portion 5 with a diameter of about 3.11 mm, a single magnet with a diameter of 2.59 mm and height of 1.15 mm, pole pieces 40, 45 with equal diameters of 2.21 mm. The upper and lower conductive coils 20, 80 were fabricated from 12 μm copper wire and each had inner and outer diameters of 2.36 mm and 2.56 mm, respectively. Naturally other dimensions, shapes of housing parts and internal components may be used depending on the requirements of a particular application.

The straight upper coil 20 may comprise windings of individually insulated aluminium or copper wires of diameters less than 50 μm or preferably less than 20 μm such as about 12 μm and with a minimum insulation layer consistent with coil formation. The cylindrical inner housing portion 5 comprises a magnetically conductive material of high permeability such as a Cobalt-Iron alloy with trace elements and form part of a common magnetic flux path which additionally extends through the upper and lower magnetic gaps and upper and lower pole pieces (15, 55) and (40, 45), respectively.

The centrally positioned permanent magnet 11 extends radially so as to contact and abut an inner sidewall portion of the cylindrical inner housing portion 5. The present embodiment is particularly well-suited for miniaturization because a substantial part of the volume trapped below the upper and lower diaphragms 25, 50, respectively, is filled up with permanent magnet material so as to make efficient use of available space inside the transducer housing 7. Naturally, the single centrally positioned magnet 11 could be replaced with a pair of separate and abutted magnets of appropriate polarity. According to the present embodiment of the invention, rear or back volume for the upper and lower diaphragms is provided inside the rectangular housing portion 7 in form of rear chambers 85 and 86. The rear chambers 85 and 86 are acoustically coupled to respective air volumes below diaphragms 25, 50 through a pair of upper sound or acoustical apertures 26 and a pair of lower sound apertures 28 provided in the wall of the cylindrical inner housing portion 5. The rectangular housing portion 7 preferably comprises an injection moulded thermoplastic material or a metallic material such as a ferromagnetic alloy or any combination thereof. Outer dimensions in terms of width, height and length of the rectangular housing portion 7 may vary according to requirements of a particular application. For hearing aid applications, the width, height and length may advantageously be less than 7.0 mm, 5.0 mm, and 10.0 mm, more preferably less than 4.0 mm, 3.0 mm, and 6.0 mm.

The rectangular shape of the housing portion 7 is one of many possible shapes and it will be clear to the skilled person that different shapes may be used such as polygonal, cylindrical, disc-shaped, hexagonal etc. Likewise, illustrated mating shapes of the cylindrical inner housing portion 5 and the centrally positioned disc-shaped magnet 11 is simply one specific set of mating shapes of many other possible mating shapes. It will be apparent to the skilled person that different mating shapes may be used such as polygonal, round, oval, elliptical etc.

Figure 6B:
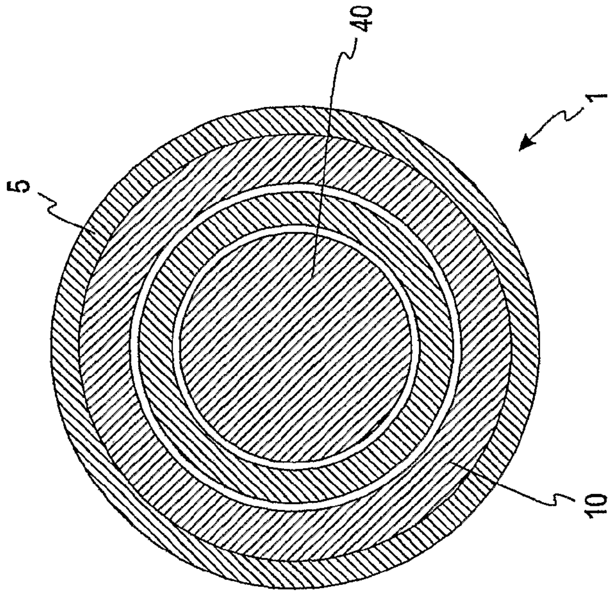
FIG. 6*a-b* show vertical and horizontal cross-sectional views of a cylindrical dual-diaphragm receiver or loudspeaker comprising a common back volume between the diaphragms according to a fourth embodiment of the invention.
Figure 6A:
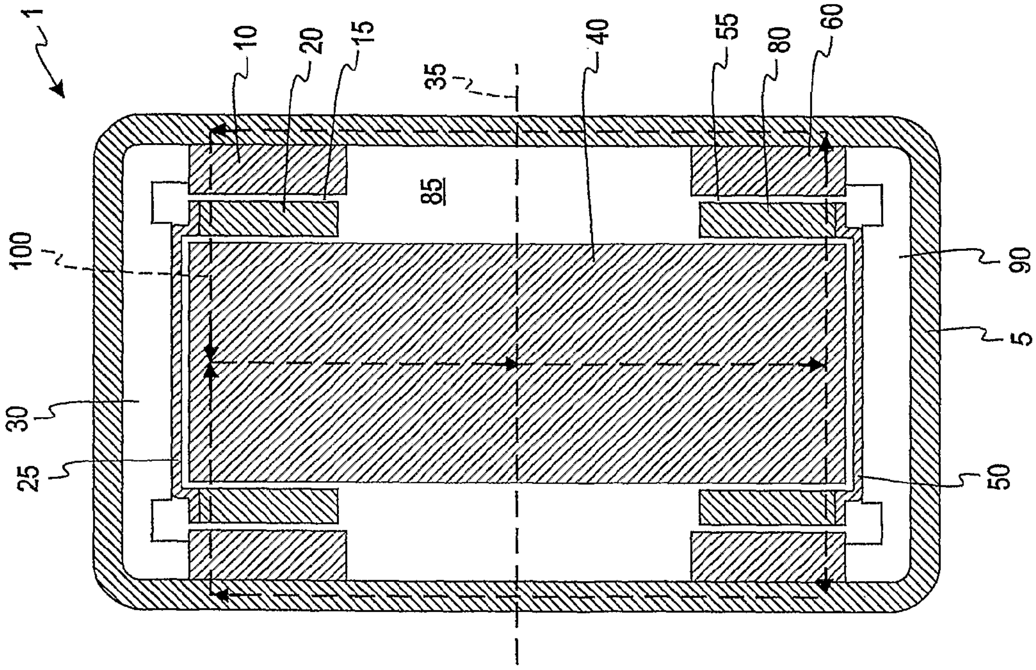

FIGS. 6*a* and 6*b* show vertical and horizontal cross-sectional views of dual-diaphragm electroacoustic transducer 1 according to another embodiment of the invention. The transducer 1 is configured as a miniature loudspeaker or receiver and comprises a substantially cylindrical housing 5 fabricated in Vacoflux or other suitable magnetically permeable material of high saturation flux density and high relative permeability. A physical layout of the miniature receiver 1 comprises two substantially identical halves arranged substantially mirror symmetrically around a central plane 35 extending parallelly to an upper diaphragm 25 and a lower diaphragm 50. The outer housing diameter is preferably selected to a value between 3 and 5 mm such as about 3.0 mm and the length to about 5.0 for embodiments suitable for application in mobile terminals and hearing prostheses.

While the previously-described embodiments of the invention preferably relied on a magnet assembly that contained a single centrally located permanent magnet, the present embodiment of the invention uses upper and lower collar or doughnut shaped permanent magnets 10 and 60, respectively, which are magnetized in opposite orientations. The upper magnet 10 is magnetized so as to create a radial inwardly oriented magnetic flux within a circularly shaped upper magnetic gap 15, while lower magnet 60 is adapted to create a radial outwardly oriented magnetic flux within circularly shaped lower magnetic gap 55. The oppositely directed magnetic fluxes of the upper and lower magnetic gaps 15 and 55, respectively, allows the receiver 1 to operate without conventional separate magnetic return paths around each of the upper and lower magnets, 10 and 60, respectively. In accordance with the present invention, a common magnetic flux path 100 (closed path marked by arrows) comprises the upper and lower flat annular magnets 10 and 60, respectively, and the upper and lower magnetic gaps 15 and 55, respectively. The common magnetic flux path 100 may advantageously comprise a centrally positioned magnetically permeable structure or post 40 adapted to conduct magnetic flux between the upper and lower ring shaped magnets 10 and 60, respectively. An annular portion of the magnetically permeable housing 5 may also form part the common magnetic flux path 100 to provide a peripheral flux return path between the upper and lower flat annular magnets 10 and 60, respectively. The housing 5 and the centrally positioned magnetically permeable post 40 preferably comprises a ferromagnetic alloy such as a cobalt-iron alloy with trace elements, often sold under trade names such as Vacoflux, Hiperco and Vanadium Permendur, for optimum magnetic performance. However, other magnetic permeable materials could additionally or alternatively be used. The centrally positioned magnetically permeable post 40 may be secured in a fixed position inside the cylindrical housing 5 by suitable retaining members (not shown), such as flanges or brackets made of for example thermoplastic material, interconnecting the magnetically permeable post 40 and inner sidewalls of the cylindrical housing 5 by means of gluing or welding etc.

An upper part of the receiver 1 is described in the following. Inside the transducer housing 5, a first magnet assembly formed as the upper ring shaped magnet 10 is located. The upper ring shaped magnet 10 is positioned coaxially relative to an inner circumferential portion of the transducer housing 5 and in abutment therewith. The upper ring shaped magnet 10, or upper magnet, may comprise a magnetic alloy based on Nd—Fe—B alloys such as N37H. The upper magnet 10 is, as previously mentioned, magnetized in a radial inwardly direction to create a radial magnetic flux within the circularly shaped upper magnetic gap 15. In the present embodiment of the invention, the upper and lower magnets 10, 60 are adapted to create numerically identical flux densities between 0.5 and 1.5 Tesla, preferably between 0.7 and 1.2 Tesla within the respective magnetic gaps.

An electrically conductive circular straight upper coil 20, or upper voice coil, is positioned inside upper magnetic gap 15 coaxially with the ring shaped upper magnet 10 so as to leave sufficiently space to allow the upper voice coil 20 to oscillate or deflect in an unrestricted manner in an upwardly and downwardly direction. The upper voice coil 20 may comprise windings made of insulated aluminium or copper wires with a minimum insulation layer consistent with coil formation. The direction of motion of the upper voice coil 20 is substantially perpendicular to the radially-oriented magnetic flux in the annular upper magnetic gap 15 and to a direction of drive current flowing in coil windings of the upper voice coil 20 in accordance with the previously mentioned “right-hand rule”.

A circular upper edge portion of the upper voice coil is preferably attached directly to a periphery of the circular upper diaphragm 25 by means of a suitable adhesive such as an epoxy resin. Accordingly, when the upper voice coil 20 oscillates in response to a drive current applied thereto, a corresponding movement is inflicted to upper diaphragm 25 to form the upper moveable assembly. Oscillating upper diaphragm 25 creates an alternating sound pressure within upper acoustical chamber 30 formed by surrounding housing walls. A sound outlet aperture (not shown) conveys sound pressure from the upper acoustical chamber 30 to the outside of the transducer housing 5. A common back chamber 85 is enclosed below the circular upper and lower diaphragms 25, 50, respectively, and an inner portion of the housing 5.

The upper diaphragm 25 preferably comprises a thin piece of circular plastic film as a base layer such as polyethylene terepthalate with a thickness between 1 and 20 μm. An adhesively attached 20-50 μm thick foil of aluminium or aluminium-magnesium alloy could optionally be utilized to reinforce the circular upper diaphragm 25.

The mirror symmetric lower portion of receiver 1 will not be extensively described in the following because its operation, parts and dimensions substantially correspond to those of the respective counterparts of the upper portion of the receiver 1. Accordingly, a physically mirror symmetrical and vibration/mass-balanced design is provided which theoretically allows complete cancellation of vibration output of the receiver 1 due to moving upper and lower assemblies. In practice, a significant reduction in vibration output magnitude is achievable compared to a vibration magnitude of a corresponding single-diaphragm receiver with only one moveable assembly. During operation, two pairs of externally accessible electrical terminals (not shown) of the receiver 1 are connected to the respective electrically conductive upper and lower coils 20 and 80 to allow independent application of drive voltage and current for each half-assembly if desired. The receiver 1 is preferably operated by supplying substantially identical drive currents to the upper and lower coils and thus ensuring that the upper and lower diaphragms 25 and 50 move in phase.

Figure 7B:
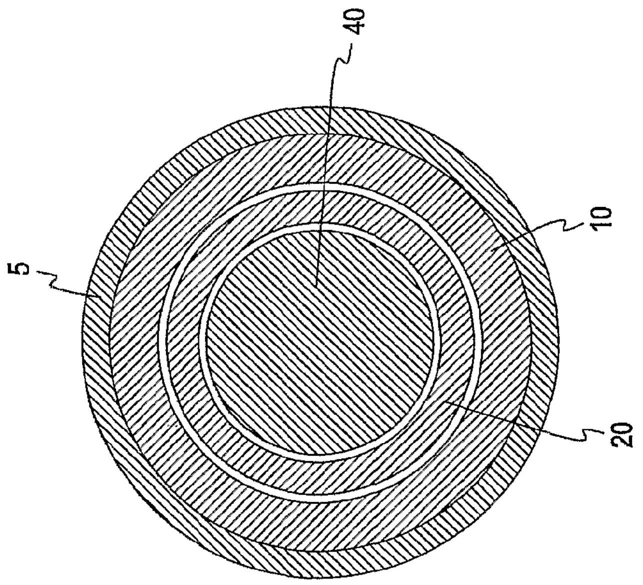
FIG. 7*a-b* show vertical and horizontal cross-sectional views of a cylindrical dual-diaphragm receiver or loudspeaker comprising upper and lower flat annular magnets coaxially positioned around respective voice coil members according to a fifth embodiment of the invention.
Figure 7A:
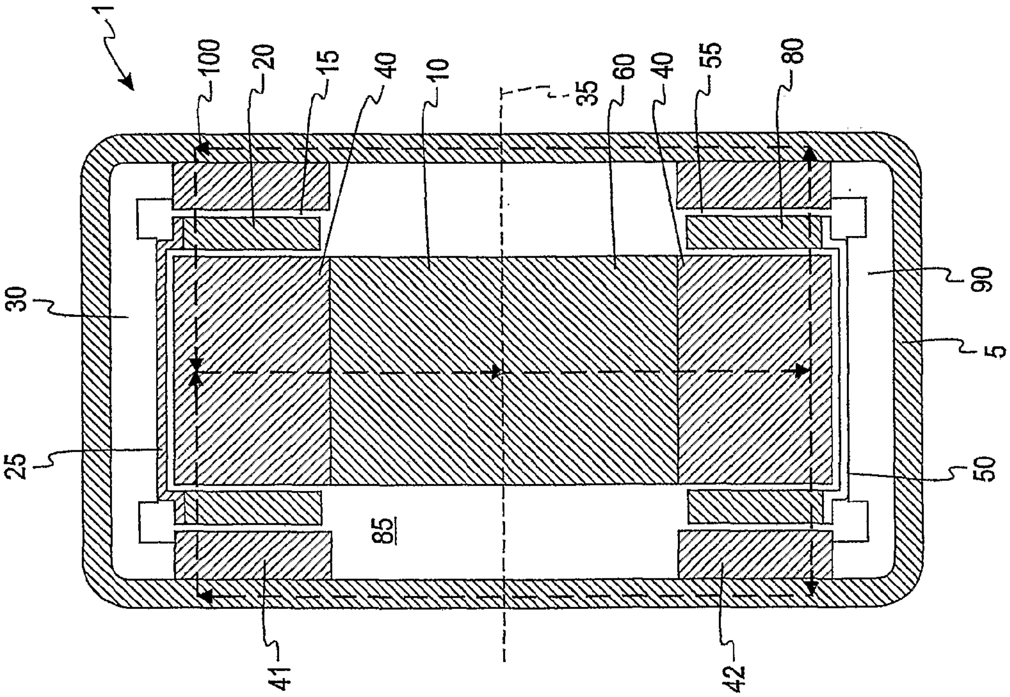

FIGS. 7*a* and 7*b* show vertical and horizontal cross-sectional views of an alternative embodiment of an electroacoustic transducer according to the invention wherein the upper and lower doughnut or collar shaped permanent magnets 10 and 60, respectively, of the embodiment disclosed in FIG. 6 have been replaced by a pair of centrally-located and adjacent permanent magnets 10, 60. Each of the permanent magnets 10, 60 is magnetized in substantially axial direction and positioned in abutment with and aligned to, respective separate magnetically permeable structures or posts 40. Upper and lower flat collar or ring shaped members 41, 42, respectively, of magnetic permeable material such as ferromagnetic alloy or compound constitute outer annular surfaces of the upper and lower magnetic gaps 15, 55 respectively. A radial inwardly oriented magnetic flux is created within the annularly shaped upper magnetic gap 15 while a radial outwardly oriented magnetic flux is created within annularly shaped lower magnetic gap 55. An attractive feature of this embodiment is that only two magnets of simple shape, such as cylindrical or rectangular magnets, are required in the magnetic circuit of the electroacoustic transducer 1. Alternatively, a single permanent magnet could replace the pair of adjacent permanent magnets 10, 60 in line with the embodiment disclosed in FIG. 1. A common magnetic flux path 100 (closed path marked by arrows) comprises the upper and lower centrally located magnets 10 and 60, respectively, and the upper and lower magnetic gaps 15 and 55, respectively and the flat collar shaped members 41, 42. A common back chamber 85 is enclosed below the circular upper and lower diaphragms 25, 50, respectively, and an inner portion of the housing 5.

Figure 8A:
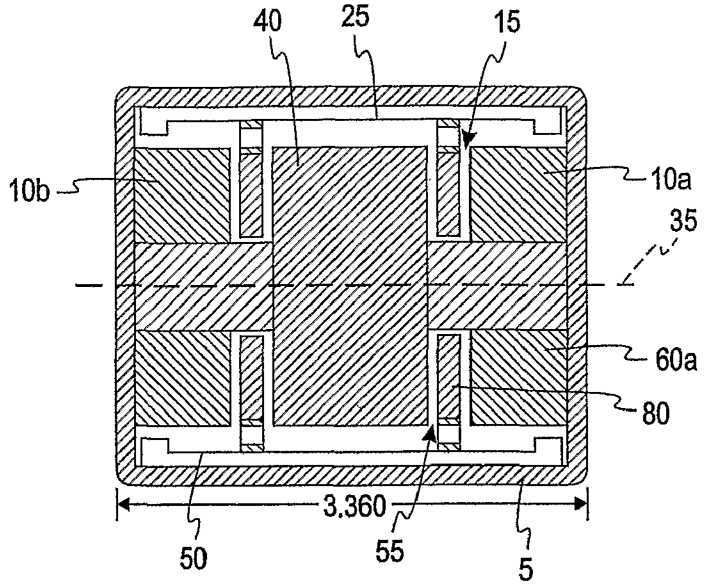
FIG. 8*a-b* show vertical and horizontal cross-sectional views of a rectangular dual-diaphragm receiver or loudspeaker comprising a rectangularly shaped upper and lower magnet assemblies arranged coaxially around respective circular voice coil members according to a sixth embodiment of the invention.
Figure 8B:
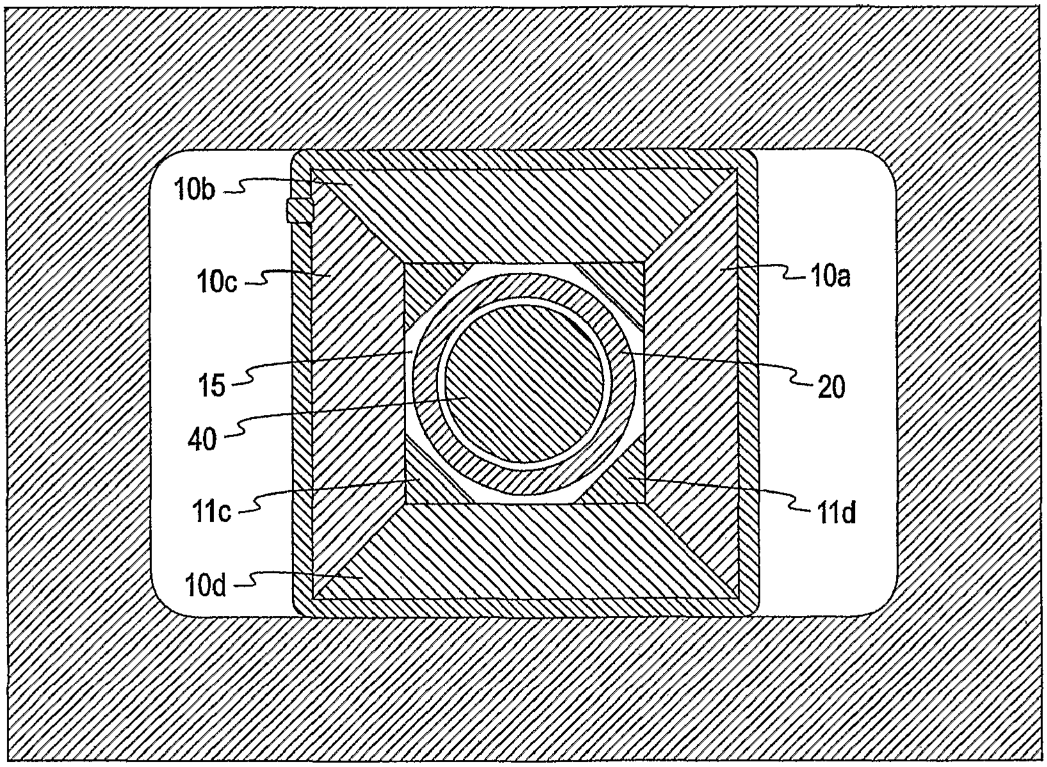

FIGS. 8*a* and 8*b* show vertical and horizontal cross-sectional views of an alternative version of the dual-diaphragm receiver embodiment of FIG. 6 wherein each of the upper and lower ring shaped magnets 10 and 60, respectively, has been replaced by a magnet assembly of four rectangular magnets abutted to each other through appropriately angled end portions to form respective rectangular magnet arrays. An upper magnetic means or magnet assembly comprises four substantially rectangular magnets 10*a-d* and the lower magnetic assembly comprises four correspondingly arranged rectangular magnets 60*a-d*. Properties of annular upper and lower magnetic gaps are approximated in the present embodiment of the invention by positioning four tri-angular upper inserts 11*a-d* of a magnetically permeable material such as Vacoflux or other ferromagnetic alloy inner corners of the upper and lower magnet assemblies. The resulting upper and lower magnetic gaps 15, 65 are accordingly substantially octagonal in shape and quite closely approximates a more ideal and preferred circular shape so as to create respective substantially radially inwardly and outwardly oriented magnetic fluxes within the upper and lower magnetic gaps 15, 55. Therefore, electrically conductive upper and lower coils 20, 80, respectively, of flat circular shape and a cylindrical central magnetically permeable post 40 are also utilised in the present embodiment of the invention.

Figure 9A:
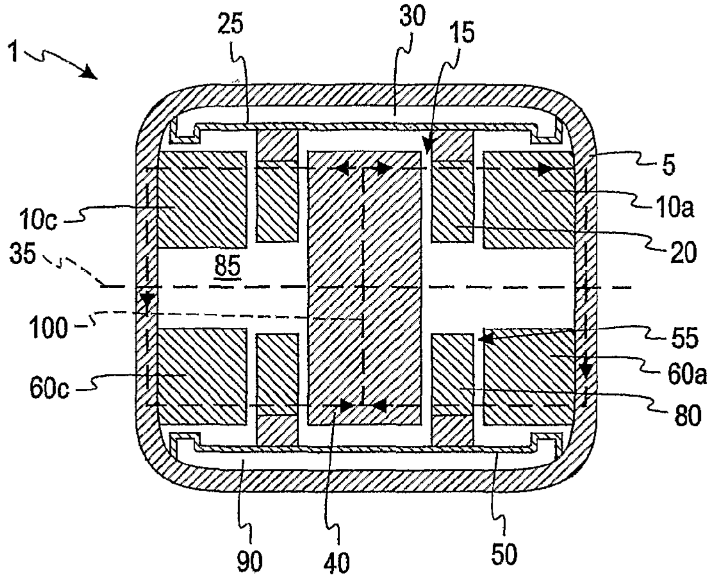
FIG. 9*a-b* show vertical and horizontal cross-sectional views of a rectangular dual-diaphragm receiver or loudspeaker comprising rectangularly shaped upper and lower magnet assemblies arranged coaxially around respective elongate voice coil members according to a seventh embodiment of the invention.
Figure 9B:
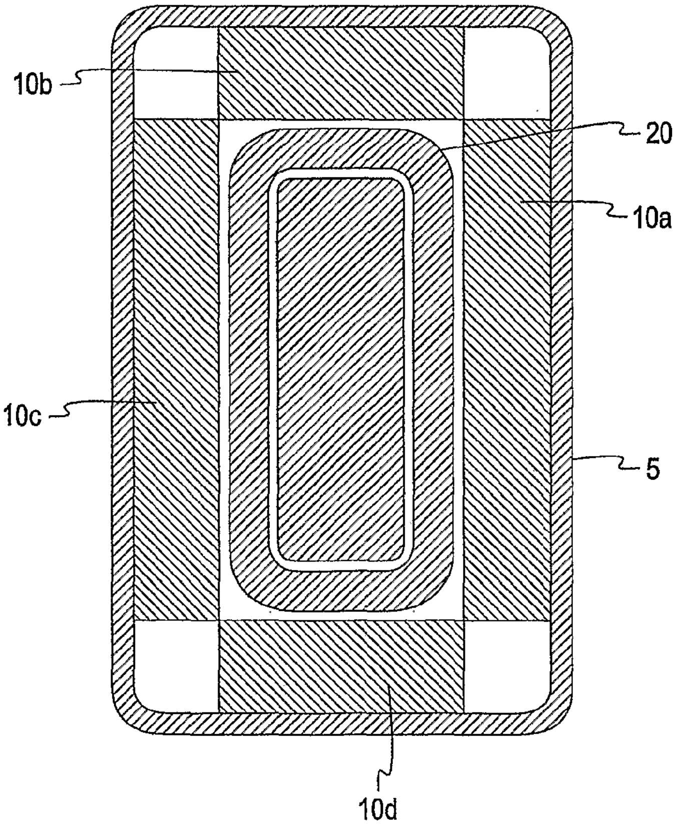

FIGS. 9*a* and 9*b* show vertical and horizontal cross-sectional views of a revised or alternative version of the dual-diaphragm receiver embodiment of FIG. 8. The present embodiment of the invention comprises eight rectangular magnets arranged in upper and lower magnet assemblies 10*a-d* and 60*a-d*, respectively. The miniature loudspeaker or receiver 1 comprises a substantially rectangular housing 5 with rounded corners. The physical layout of the receiver 1 comprises two halves arranged substantially mirror symmetrically around a central plane 35 extending parallelly to an upper diaphragm 25 and a lower diaphragm 50. Upper part of FIG. 2 shows a vertical cross-sectional view, i.e. a view in a plane perpendicular to upper and lower diaphragms 25 and 50, respectively, of the receiver 1. A first or upper magnet assembly comprises a rectangular array of four flat magnets 10*a-d* surrounding an upper elongate oval and straight electrically conductive coil 20 to approximate a coaxial placement of the elongate oval electrically conductive coil 20 in an upper continuous magnetic gap 15. The upper magnet assembly or array comprises four magnets 10*a-d* positioned with abutting end edges and cooperates to create an inwardly oriented first magnetic flux in the upper magnetic gap 15. A lower magnet assembly comprises a second rectangular magnet assembly of four flat rectangular magnets 60*a-d* positioned substantially coaxially around a lower elongate oval electrically conductive coil 80 or lower voice coil. The lower magnet assembly 60*a-d* is magnetized with opposite orientation relative to the magnetisation of the upper magnet assembly 10*a-d*, so as to create an outwardly oriented magnetic flux within rectangular shaped and continuous lower magnetic gap 55. Upper and lower movable assemblies, each comprising a respective diaphragm 25 or 50 and the upper and lower voice coils 20 or 80, respectively, are adapted for generation of respective sound pressures inside the upper and lower acoustical front chambers 30 and 90, respectively. A centrally positioned magnetically permeable post 40 is surrounded by the upper and lower voice coils 20 or 80, respectively. The magnetically permeable post 40 is adapted to conduct magnetic flux between the upper and lower magnet assemblies 10*a-d* and 60*a-d*, respectively, to create a common magnetic flux path 100 (closed path marked by arrows) which comprises upper and lower magnetic gaps 15, 55 and the upper and lower magnet assemblies.

Since a portion of the transducer housing forms part of the common magnetic flux path 100, the housing 5 may advantageously be fabricated in a ferromagnetic alloy or compound such as Vacoflux, which has a high saturation flux density and high relative permeability. Outer dimensions, i.e. width, height and length of the housing 5 are preferably around 3.36 mm, 3.0 mm and 5.36 mm, respectively. The centrally positioned magnetically permeable post has width, height and length dimensions of 0.81 mm, 2.0 mm, and 2.82 mm. Each of the largest magnets of the upper and lower magnet assembly has width, height and length dimensions of 0.675 mm, 0.70 mm, and 3.70 mm. Each of the smaller magnets of the upper and lower magnet array has width, height and length dimensions of 0.675 mm, 0.70 mm, and 1.71 mm. The electrical conductive coils 20, 80 are formed by insulated aluminium or copper windings and each coil has width, height and length dimensions of 1.56 mm, 0.60 mm, and 3.56 mm. The width of each winding portion situated within a magnetic gap is about 0.30 mm.

Figure 10A:
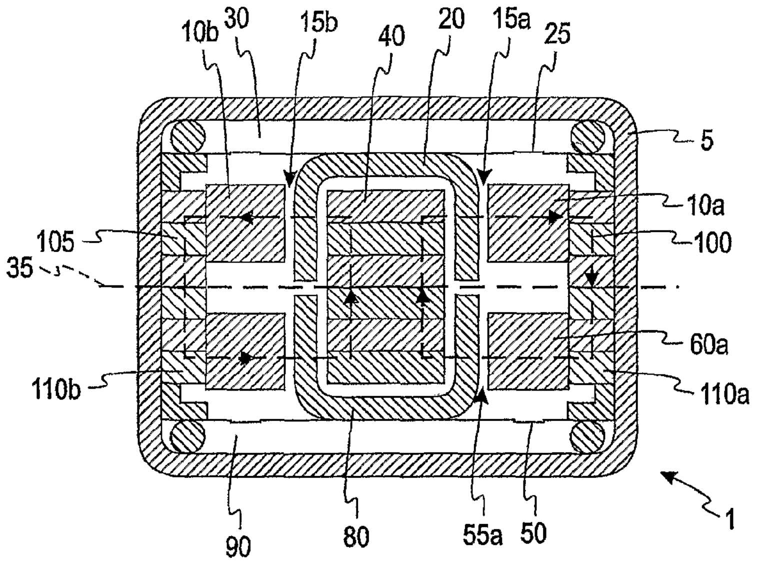
FIG. 10*a-b* show vertical and horizontal cross-sectional views of a rectangular dual-diaphragm receiver or loudspeaker with upper and lower folded voice coils placed in respective pairs of unidirectional magnetic gaps according to an eight embodiment of the invention, FIG. 11 *a-b* show vertical and horizontal cross-sectional views of a rectangular dual-diaphragm receiver or loudspeaker with upper and lower straight and elongate voice coils horizontally arranged in upper and lower pairs of unidirectional magnetic gaps according to a ninth embodiment of the invention.
Figure 10B:
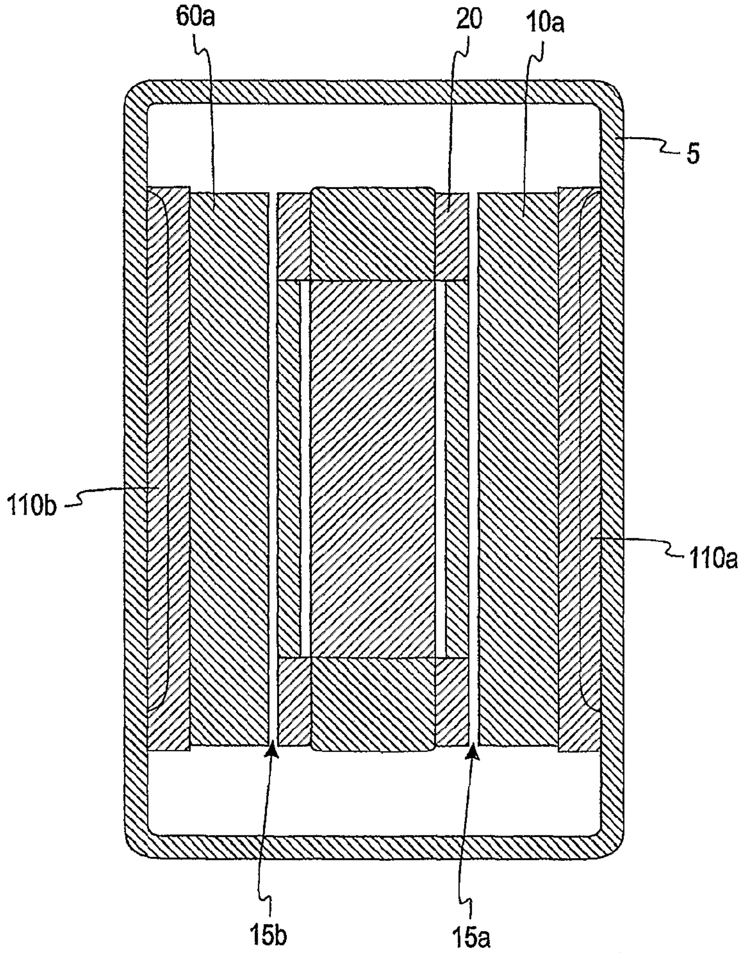

FIGS. 10*a* and 10*b* show vertical and horizontal cross-sectional views of a rectangular dual-diaphragm miniature loudspeaker or receiver 1 that comprises a pair of oppositely positioned and folded electrically conductive coils. The present embodiment comprises a substantially rectangular housing 5 with rounded corners. The receiver 1 has a physical layout which comprises two physically identical halves arranged substantially mirror symmetrically around a central plane 35 extending parallelly to a substantially rectangular upper diaphragm 25 and a substantially rectangular lower diaphragm 50. A first magnet assembly comprises elongate rectangular permanent magnets 10*a* and 60*a* vertically aligned above each other. A second magnet assembly, which is arranged in the same horizontal plane as the first magnet assembly, comprises elongate rectangular permanent magnets 10*b* and 60*b* vertically aligned above each other. The receiver 1 may have a substantially mirror symmetrical physical layout around a central vertical plane central plane extending orthogonally to the upper diaphragm 25 and the lower diaphragm 50. A common back chamber 85 is formed below the upper and lower diaphragms 25, 50, respectively, and an inner portion of the housing 5.

In contrast to the previously described embodiments of the invention, the present embodiment comprises two common magnetic flux paths sharing a common leg or post. A first common magnetic flux path 100 (closed path marked by arrows) comprises a first magnet assembly including the upper rectangular magnet 10*a* and lower rectangular magnet 60*a*. A second common magnetic flux path 105 (closed path marked by arrows) comprises a second magnet assembly including the upper magnet 10*b* and lower magnet 60*b*. The first common magnetic flux path 100 extends through a discontinuous, or unidirectional, upper magnetic gap 15*a* and upper rectangular magnet 10*a* to create an outwardly oriented first magnetic flux in the upper magnetic gap 15*a*. The first common magnetic flux path 100 further extends in vertical direction, i.e. substantially orthogonal to the upper diaphragm 25 and lower diaphragm 50, through a flat rectangular pole plate 110*a* and through lower rectangular magnet 60*a* and into lower unidirectional magnetic gap 55*a*. A centrally positioned magnetically permeable structure 40 forms a vertical flux return path from the lower unidirectional magnetic gap 55*a* back to the upper magnetic gap 15*a* to close the first common magnetic flux path 100.

The second common magnetic flux path 105 extends through discontinuous upper magnetic gap 15*b* and upper rectangular magnet 10*b* to create a second outwardly oriented second magnetic flux in the upper magnetic gap 15*b*. The second common magnetic flux path 105 further extends in vertical direction, i.e. substantially orthogonal to the upper diaphragm 25 and lower diaphragm 50, through a flat rectangular pole plate 110*b* and through lower rectangular magnet 60*b* and into lower unidirectional magnetic gap 55*b*. The centrally positioned magnetically permeable structure 40 forms a vertical flux return path from the lower unidirectional magnetic gap 55*b* back to the upper magnetic gap 15*b* to close the second common magnetic flux path. Accordingly, in the present embodiment of the invention, the first and second common magnetic flux paths 100, 105, respectively, both comprise the centrally positioned magnetically permeable structure 40. Furthermore, a folded upper electrically conductive coil 20 or upper folded voice coil is positioned in both of the first and third discontinuous magnetic gaps so that this upper folded voice coil comprise a first portion of coil windings positioned within the first common magnetic flux path and second portion of coil windings positioned within the second common magnetic flux path and a third portion of coil windings rigidly attached to the upper diaphragm 25 and positioned outside any of the magnetic gaps. Finally, a folded lower electrically conductive coil 80 or lower folded voice coil is positioned both in the second and fourth discontinuous magnetic gaps so that this lower folded voice coil 80 comprise a first portion of coil windings positioned within the first common magnetic flux path 100 and second portion of coil windings positioned within the second common magnetic flux path 105 and a third portion of coil windings rigidly attached to the lower diaphragm 50 and positioned outside any of the magnetic gaps.

Figure 11A:
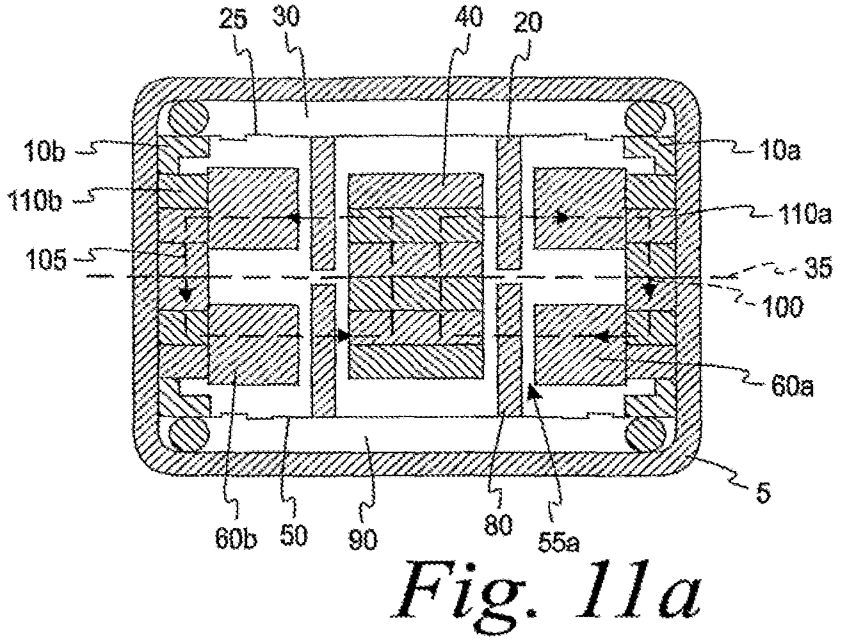
Figure 11B:
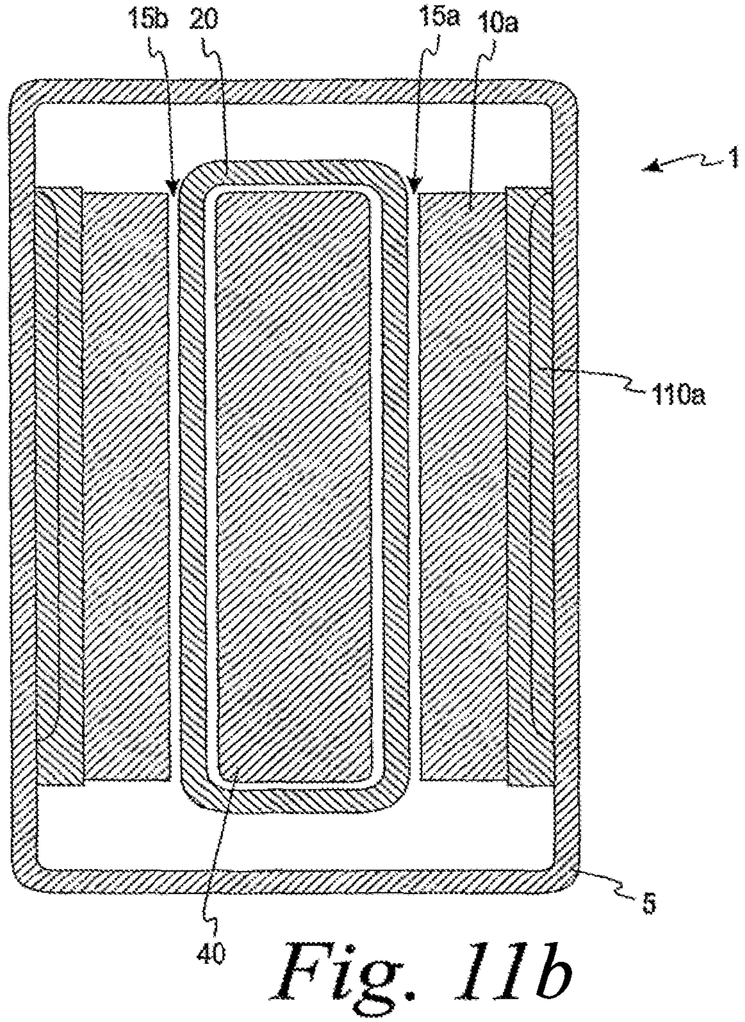

FIGS. 11*a* and 11*b* show vertical and horizontal cross-sectional views of a rectangular dual-diaphragm receiver with a pair of oppositely positioned and elongate and straight electrically conductive coils 20, 80. This embodiment of the invention has a number of construction details in common with the embodiment of the invention discussed and disclosed in connection with FIG. 10. A significant difference is that each of the upper and lower folded voice coils has been replaced with a straight elongate voice coil in form of upper voice coil 20 and lower voice coil 80. The present embodiment comprises a total of four discontinuous magnetic gaps and two common magnetic return paths sharing a common leg or post and encircling respective pairs of discontinuous magnetic gaps.

A first common magnetic flux path 100 extends through a first and unidirectional upper magnetic gap 15*a* and the upper rectangular magnet 10*a* to create an outwardly oriented first magnetic flux in the upper magnetic gap 15*a*. The first common magnetic flux path 100 further extends in vertical direction, i.e. substantially orthogonal to the upper diaphragm 25 and lower diaphragm 50, through a flat rectangular pole plate 110*a* and through a lower rectangular magnet 60*a* and into a second lower unidirectional magnetic gap 55*a*. A centrally positioned magnetically permeable structure 40 forms a vertical flux return path from the lower unidirectional magnetic gap 55*a* back to the upper magnetic gap 15*a* to close the first common magnetic flux path 100 which accordingly comprises a first magnet assembly in form of first and second magnets 10*a*, 60*a* and first and second air gaps 15*a*, 55*a*.

The second common magnetic flux path 105 extends through a third discontinuous upper magnetic gap 15*b* and the third upper rectangular magnet 10*b* to create a second outwardly oriented second magnetic flux in the upper magnetic gap 15*b*. The second common magnetic flux path further extends in vertical direction, i.e. substantially orthogonal to the upper diaphragm 25 and lower diaphragm 50, through a flat rectangular pole plate 110*b* and through lower rectangular magnet 60*b* and into lower unidirectional magnetic gap 55*b*. The centrally positioned magnetically permeable structure 40 forms a vertical flux return path from the lower unidirectional magnetic gap 55*b* back to the upper magnetic gap 15*b* to close the second common magnetic flux path 105.

Figure 12A:
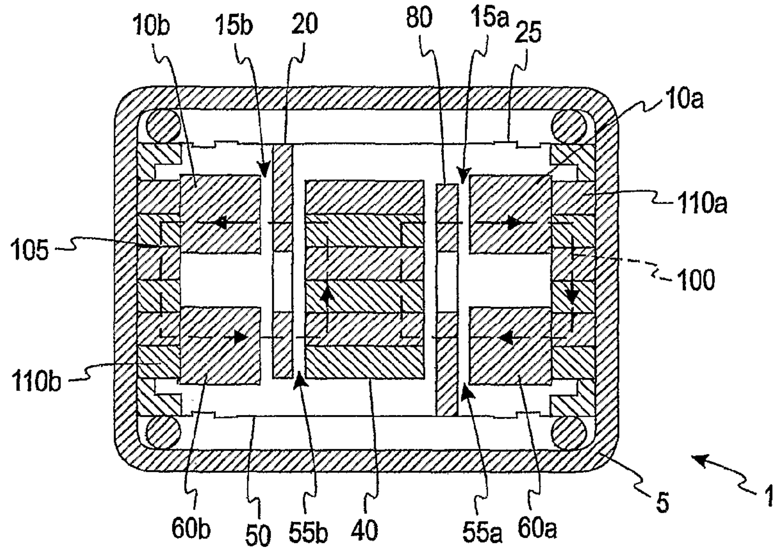
FIG. 12*a-b* show vertical and horizontal cross-sectional views of a rectangular dual-diaphragm receiver or loudspeaker with left and right straight and elongate voice coils vertically arranged in respective pairs of left and right unidirectional magnetic gaps according to a tenth embodiment of the invention.
Figure 12B:
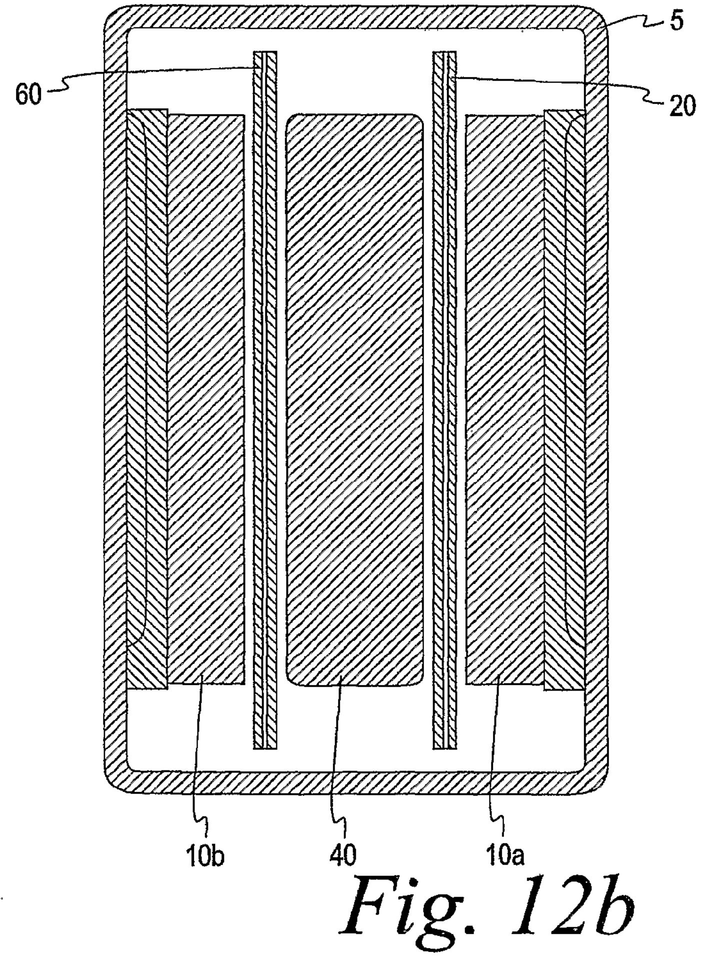

FIGS. 12*a* and 12*b* show vertical and horizontal cross-sectional views of a rectangular dual-diaphragm receiver with a pair of oppositely positioned and straight electrically conductive coils. The present embodiment deviate from the embodiment discussed and disclosed in connection with FIG. 11 above by employing a set of vertically oriented straight and elongate electrically conductive coils, 20 and 80 instead of the horizontally or laterally oriented set of electrically conductive coils. Accordingly, the present embodiment is not mirror symmetrical around a central horizontal transducer plane.

The present embodiment comprises a substantially rectangular housing 5 with rounded corners. The receiver 1 comprises two halves having parallelly positioned upper and lower diaphragms 25 and 50, respectively. The upper diaphragm is driven by a first elongate electrically conductive coil 20 attached to the diaphragm 25 along a longitudinal peripheral edge or side portion of the electrically conductive coil 20. An upper set of magnets comprises two separate elongate rectangular magnets 10*a-b* positioned substantially oppositely around a centrally positioned magnetically permeable structure 40 and in a common upper plane extending substantially parallelly to the upper and lower diaphragms 25 and 50, respectively. A lower set of magnets comprises two separate elongate rectangular magnets 60*a-b* also positioned substantially oppositely around a lower portion of the centrally positioned magnetically permeable structure 40 vertically aligned the upper set of magnets 10*a-b* in a lower common plane. A first common magnetic flux path 100 extends through a first and unidirectional upper magnetic gap 15*a* and the upper rectangular magnet 10*a* to create an outwardly oriented first magnetic flux in the upper magnetic gap 15*a*. The first common magnetic flux path 100 further extends in vertical direction, i.e. substantially orthogonal to the upper diaphragm 25 and lower diaphragm 50, through a flat rectangular pole plate 110*a* and through a lower rectangular magnet 60*a* and into a second lower unidirectional magnetic gap 55*a*. The central magnetically permeable structure 40, which preferably comprises a ferromagnetic material or alloy, forms a vertical flux return path from the lower unidirectional magnetic gap 55*a* back to the upper magnetic gap 15*a* to close the first common magnetic flux path 100.

The second common magnetic flux path 105 extends through a third discontinuous upper magnetic gap 15*b* and a third and upper rectangular magnet 10*b* to create a second outwardly oriented second magnetic flux in a second upper magnetic gap 15*b*. The second common magnetic flux path 105 furthermore extends in vertical direction through a flat rectangular pole plate 110*b* and through lower rectangular magnet 60*b* and into lower unidirectional magnetic gap 55*b*. The magnetically permeable structure 40 forms a vertical flux return path from the lower unidirectional magnetic gap 55*b* back to the upper magnetic gap 15*b* to close the second common magnetic flux path 105. Accordingly, both the first and second common magnetic flux paths extend through magnetic permeable post 4 in a plane that is substantially orthogonal to the both the upper and lower diaphragms 25, 50, respectively.

Figure 13A:
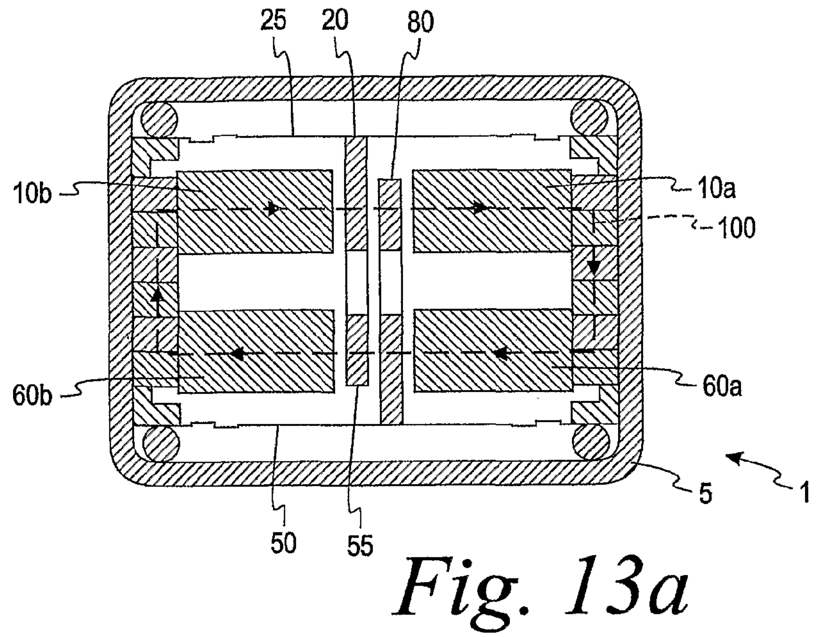
FIG. 13*a-b* show vertical and horizontal cross-sectional views of a rectangular dual-diaphragm receiver or loudspeaker with left and right straight and elongate voice coils vertically and adjacently arranged in a pair of central unidirectional magnetic gaps according to an eleventh embodiment of the invention.
Figure 13B:
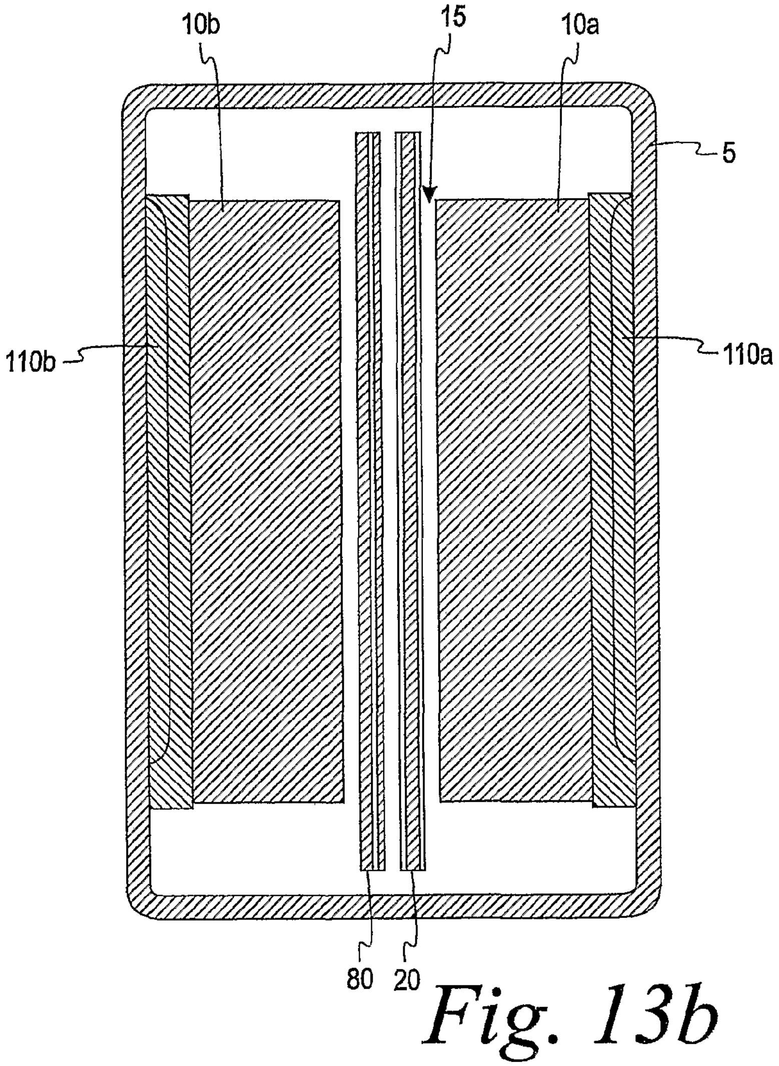

FIGS. 13*a* and 13*b* show vertical and horizontal cross-sectional views of a rectangular dual-diaphragm receiver with a pair of adjacently positioned straight electrically conductive coils. The present embodiment deviate from the embodiment discussed and disclosed in connection with FIG. 11 above by the lack of the centrally positioned magnetically permeable structure or post shared by the first and second magnetic flux paths. The present embodiment of the invention comprises a single common magnetic flux path that extends through two separate unidirectional magnetic gaps.

The receiver 1 comprises a housing 5 having arranged therein four separate rectangular permanent magnets 10*a, b* and 60*a, b* having respective plane side surfaces arranged in a manner that forms an upper magnetic gap 15 between side surfaces of permanent magnets 10*a* and 10*b* and a lower magnetic gap 55, aligned below the upper magnetic gap 15, in between side surfaces of permanent magnets 60*a* and 60*b*. A first flat and straight electrically conductive coil 20 is attached to an upper diaphragm 25 along a longitudinal peripheral edge portion of the conductive coil 20 and oriented vertically relative to the upper diaphragm 25. A common magnetic flux path 100 comprises the first and second magnetic gap 15, 55 and the four separate rectangular permanent magnets 10*a, b* and 60*a,b* and a pair of flat rectangular pole pieces 110*a,b* abutted to respective side portions of the transducer housing 5 to conduct magnetic flux laterally. The first electrically conductive coil 20 has respective coil winding portions positioned in the first and second magnetic gaps. The first magnetic gap 15 has approximately twice the width of the corresponding magnetic gap utilized in the embodiment disclosed in connection with FIG. 12. Because twice as much magneto motive force is available by virtue of the set of cooperating rectangular magnets 10*a, b*, the resulting magnetic flux density within the magnetic gaps is approximately equal. The first flat and straight electrically conductive coil 20 is positioned adjacent to a second flat and straight electrically conductive coil 60 of similar dimensions in a manner that allows both coils to be positioned within the same magnetic gaps of the transducer 1, i.e. within the first and second magnetic gaps 15, 55. The second conductive coil 80 is the attached to a lower diaphragm 25 along a longitudinal peripheral edge portion and oriented vertically relative to the upper and lower diaphragms.

The invention claimed is:

1. A miniature electroacoustic transducer comprising:

a transducer housing comprising a sound aperture, and a magnetically conductive first housing portion surrounding a magnet assembly;

the magnet assembly adapted to generate a first magnetic flux with a first predetermined orientation within a first magnetic gap and adapted to generate a second magnetic flux with a second predetermined orientation within a second magnetic gap;

a common magnetic flux path comprising the magnet assembly and the first and second magnetic gaps;

a first moveable assembly comprising a first electrically conductive coil positioned in the first magnetic gap and coupled to a first diaphragm to enable motion of the first moveable assembly in a first direction of motion substantially perpendicular to the first magnetic flux;

a second moveable assembly comprising a second electrically conductive coil positioned in the second magnetic gap and coupled to a second diaphragm to enable motion of the second moveable assembly in a second direction of motion substantially perpendicular to the second magnetic flux, wherein said magnet assembly comprises a centrally positioned permanent magnet assembly operatively secured to an inner side wall portion of the magnetically conductive first housing portion, wherein said common magnetic flux path comprises the magnetically conductive first housing portion.

2. A miniature electroacoustic transducer according to claim 1, wherein the magnet assembly comprises:

a first magnet assembly adapted to generate the first magnetic flux within the first magnetic gap; and a second magnet assembly adapted to generate the second magnetic flux within the second magnetic gap.

3. A miniature electroacoustic transducer according to claim 1, wherein the first magnetic gap comprises a continuous magnetic gap and the second magnetic gap comprises a continuous magnetic gap.

4. A miniature electroacoustic transducer according to claim 1, wherein the centrally positioned permanent magnet assembly exclusively contains a single centrally located permanent magnet.

5. A miniature electroacoustic transducer according to claim 1, wherein the first magnetic flux and the second magnetic flux are substantially oppositely directed.

6. A miniature electroacoustic transducer according to claim 1, wherein the common magnetic flux path comprises a closed magnetic loop extending in a plane substantially parallel to the direction of motion of the first moveable assembly.

7. A miniature electroacoustic transducer according to claim 1, wherein the first and second directions of motion are substantially identically or oppositely oriented.

8. A miniature electroacoustic transducer according to claim 1, wherein the centrally positioned permanent magnet assembly and the first and second moveable assemblies form a substantially mirror symmetrical entity around a central plane extending parallelly to the first and second diaphragms.

9. A miniature electroacoustic transducer according to claim 1, wherein the first and second moveable assemblies have substantially identical masses.

10. A miniature electroacoustic transducer according to claim 1 any of the preceding claims, wherein the transducer housing is adapted to combine acoustic signals generated by the first and second diaphragms and direct a resulting acoustical signal through a single sound outlet aperture of the transducer housing.

11. A miniature electroacoustic transducer according to claim 1, wherein a peripheral surface of the centrally positioned permanent magnet assembly or assemblies abuts the magnetically conductive first housing portion.

12. A miniature electroacoustic transducer according to claim 11, wherein the magnet assembly is axially magnetized and has a closed peripheral magnet surface extending in a plane perpendicular to an axial direction.

13. A miniature electroacoustic transducer according to claim 12, wherein:

a volume enclosed between the first and second moveable assemblies and the magnetically conductive first housing portion is divided into an upper back chamber arranged below the first diaphragm and a lower back chamber arranged below the second diaphragm by the centrally positioned permanent magnet assembly.

14. A miniature electroacoustic transducer according to claim 12, wherein:

a volume enclosed between the first and second moveable assemblies and the magnetically conductive first housing portion comprises a common back chamber.

15. A miniature electroacoustic transducer according to claim 13, wherein each of the upper and lower back chambers comprises a respective back chamber sound aperture.

16. A miniature electroacoustic transducer according to claim 1, wherein the magnetically conductive first housing portion further surrounds the first and second moveable assemblies.

17. A miniature electroacoustic transducer according to claim 1, wherein the transducer housing comprises:

a second housing portion extending above and covering the first diaphragm to form a first front chamber having a first side facing or frontally facing sound aperture, a third housing portion extending above and covering the second diaphragm to form a second front chamber having a second side facing or frontally facing sound aperture.

18. A miniature electroacoustic transducer according to claim 15, comprising:

an outer transducer housing portion forming a substantially closed acoustical chamber positioned adjacent to an outer surface portion of the magnetically conductive first housing portion;

an acoustical connection between back chamber sound aperture or apertures and the substantially closed acoustical chamber to provide a combined and enlarged effective back chamber of the miniature electroacoustic transducer.

19. A miniature electroacoustic transducer according to claim 15, comprising:

a sound outlet port surrounding the first and second front chamber sound apertures to sum respective sound pressures generated by the first and second diaphragms and direct a resulting sound pressure out through the sound outlet port.

20. A miniature electroacoustic transducer according to claim 1, wherein the first and the second electrically conductive coils are directly attached to the first and second diaphragms, respectively.

21. A miniature electroacoustic transducer according to claim 1, wherein the centrally positioned permanent magnet assembly comprises an axially magnetized permanent magnet.

22. A miniature electroacoustic transducer according to claim 21, wherein upper and lower flat pole pieces are arranged in abutment with respective magnetic poles of the centrally positioned and axially magnetized permanent magnet to conduct magnetic flux toward circular upper and lower magnetic gaps, respectively.

23. A miniature electroacoustic transducer according to claim 22, wherein the centrally positioned and axially magnetized permanent magnet comprises an upper and a lower notch or step extending along an upper and a lower periphery of the permanent magnet.

24. A miniature electroacoustic transducer according to claim 22, wherein the centrally positioned and axially magnetized permanent magnet is disc-shaped and the upper and lower flat pole pieces are disc-shaped.

25. A portable communication device, such as a hearing prostheses or mobile phone, comprising an electroacoustic transducer according to claim 1.

26. A miniature electroacoustic transducer according to claim 14, wherein the common back chamber comprises a back chamber sound aperture.

27. A miniature electroacoustic transducer according to claim 26, comprising:

an outer transducer housing portion forming a substantially closed acoustical chamber positioned adjacent to an outer surface portion of the magnetically conductive first housing portion, an acoustical connection between back chamber sound aperture or apertures and the substantially closed acoustical chamber to provide a combined and enlarged effective back chamber of the miniature electroacoustic transducer.

28. A miniature electroacoustic transducer according to claim 26, comprising:

a sound outlet port surrounding the first and second front chamber sound apertures to sum respective sound pressures generated by the first and second diaphragms and direct a resulting sound pressure out through the sound outlet port.

* * * * *